(12) United States Patent
Tokairin

(10) Patent No.: US 8,988,157 B2
(45) Date of Patent: Mar. 24, 2015

(54) OSCILLATION CIRCUIT AND SEMICONDUCTOR INTEGRATED CIRCUIT INCLUDING THE SAME

(75) Inventor: Takashi Tokairin, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 80 days.

(21) Appl. No.: 13/525,099

(22) Filed: Jun. 15, 2012

(65) Prior Publication Data

US 2013/0038364 A1 Feb. 14, 2013

(30) Foreign Application Priority Data

Aug. 11, 2011 (JP) ................. 2011-175732

(51) Int. Cl.
| | |
|---|---|
| *H03K 3/0231* | (2006.01) |
| *H03K 4/501* | (2006.01) |
| *H03L 7/02* | (2006.01) |
| *H03K 4/502* | (2006.01) |
| *G06F 1/04* | (2006.01) |
| *H03L 7/18* | (2006.01) |

(52) U.S. Cl.
CPC ........ *H03K 4/502* (2013.01); *G06F 1/04* (2013.01); *H03L 7/18* (2013.01)
USPC ............................ 331/111; 331/143; 331/1 R

(58) Field of Classification Search
CPC ......... H03K 4/501; H03K 4/502; H03K 4/50; H03K 4/52; H03K 3/0231; H03L 7/02
USPC ................ 331/111, 143, 1 R, 34, 78
See application file for complete search history.

(56) References Cited

U.S. PATENT DOCUMENTS

| | | | | |
|---|---|---|---|---|
| 5,105,169 | A  * | 4/1992 | Yamazaki et al. ............... | 331/34 |
| 6,486,717 | B2 * | 11/2002 | Kinoshita et al. ............. | 327/175 |
| 7,138,880 | B2 * | 11/2006 | Ma et al. ........................ | 331/143 |
| 7,332,944 | B2 * | 2/2008 | Fujita et al. ................... | 327/113 |

(Continued)

FOREIGN PATENT DOCUMENTS

| | | |
|---|---|---|
| JP | 2006-086997 A | 3/2006 |
| JP | 2007-243922 A | 9/2007 |

(Continued)

OTHER PUBLICATIONS

Japanese Office Action dated Sep. 16, 2014 with English Translation thereof.

*Primary Examiner* — Ryan Johnson
(74) *Attorney, Agent, or Firm* — McGinn IP Law Group, PLLC

(57) ABSTRACT

An oscillation circuit includes an RS flip-flop for generating output signals based on a set signal and a reset signal, an electric-charge charge/discharge unit which has first and second capacitors and charges or discharges the first and second capacitors complementarily based on the output signals, a first comparator which compares a first voltage according to electric charge accumulated in the first capacitor and a first reference voltage and outputs the set signal, a second comparator which compares a second voltage according to electric charge accumulated in the second capacitor and the first reference voltage and outputs the reset signal, and a control unit for controlling a timing at which respective voltage levels of the first reference voltage and the first voltage match and a timing at which respective voltage levels of the first reference voltage and the second voltage match according to a frequency of the output signals.

25 Claims, 29 Drawing Sheets

(56) References Cited

U.S. PATENT DOCUMENTS

| | | | |
|---|---|---|---|
| 7,528,673 B2 | 5/2009 | Shibuya et al. | |
| 7,649,425 B2 * | 1/2010 | Nervegna | 331/176 |
| 7,705,685 B2 * | 4/2010 | Ng et al. | 331/57 |
| 7,741,887 B2 * | 6/2010 | Kubo | 327/131 |
| 8,049,571 B2 * | 11/2011 | Yeh et al. | 331/78 |
| 8,085,099 B2 * | 12/2011 | Pancholi et al. | 331/17 |
| 8,212,624 B2 * | 7/2012 | Tokunaga et al. | 331/111 |
| 2007/0182499 A1 | 8/2007 | Wakai et al. | |

FOREIGN PATENT DOCUMENTS

| | | |
|---|---|---|
| WO | WO 2010/016167 A1 | 2/2010 |
| WO | WO 2010016167 A1 * | 2/2010 |

* cited by examiner

OSCILLATION CIRCUIT AND SEMICONDUCTOR INTEGRATED CIRCUIT INCLUDING THE SAME

CROSS-REFERENCE TO RELATED APPLICATIONS

The disclosure of Japanese Patent Application No. 2011-175732 filed on Aug. 11, 2011 including the specification, drawings and abstract is incorporated herein by reference in its entirety.

BACKGROUND

The present invention relates to an oscillation circuit and a semiconductor integrated circuit including the same, and in particular, relates to an oscillation circuit for outputting an oscillation signal having an accurate frequency and a semiconductor integrated circuit including the same.

In recent years, oscillation circuits for outputting oscillation signals having accurate frequencies have been required. Related techniques are disclosed in Japanese Unexamined Patent Publication No. 2007-243922 (Patent Document 1) and Japanese Unexamined Patent Publication No. 2006-86997 (Patent Document 2).

An oscillation circuit disclosed in Patent Document 1 includes first and second capacitors, first and second comparison circuits, an RS flip-flop circuit, and first and second charge/discharge control circuits.

The first and second capacitors are charged or discharged by current generated by a constant current source. The first comparison circuit compares a first voltage V1 according to the amount of electric charge stored in the first capacitor and a first reference voltage Vst, and outputs a first signal indicating that the first voltage V1 has reached the first reference voltage Vst. The second comparison circuit compares a second voltage V2 according to the amount of electric charge stored in the second capacitor and a second reference voltage Vst, and outputs a second signal indicating that the second voltage V2 has reached the second reference voltage Vst.

The RS flip-flop circuit is set by one of the first signal and the second signal, and reset by the other. The first charge/discharge control circuit charges the first capacitor when the RS flip-flop circuit is set, and discharges the first capacitor when the RS flip-flop circuit is reset. The second charge/discharge control circuit charges the second capacitor when the RS flip-flop circuit is reset, and discharges the second capacitor when the RS flip-flop circuit is set.

Thereby, according to the description in Patent Document 1, the oscillation circuit outputs an oscillation signal having a stable frequency even when noise occurs.

An oscillation circuit disclosed in Patent Document 2 includes an oscillator, a frequency-voltage converter, a difference detector, and an integrator, which are coupled in a closed loop. The oscillator generates an output signal which oscillates at a frequency according to a control signal. The frequency-voltage converter generates a detection signal having a voltage according to the frequency of the output signal. The difference detector generates a difference signal indicating the difference between the detection signal and a reference signal. The integrator generates a control signal by integrating the difference signal.

Further, the oscillator has a relaxation signal generation circuit for generating a relaxation control signal by relaxing a change in the control signal and an output signal generation circuit for generating an output signal which oscillates at a frequency according to the relaxation control signal.

Thereby, according to the description in Patent Document 2, the oscillation circuit generates a high-frequency output signal at low power consumption with stability and accuracy. Further, to suppress an increase in power consumption and a reduction in frequency accuracy, the oscillation circuit is configured without a comparator.

SUMMARY

In the oscillation circuit disclosed in Patent Document 1, ideally the output signal of the RS flip-flop circuit changes from an L level to an H level or changes from the H level to the L level (the logic value thereof changes) at the moment when the first voltage V1 reaches the reference voltage Vst or the second voltage V2 reaches the reference voltage Vst. However, in reality, the logic value of the output signal (oscillation signal) of the RS flip-flop circuit changes after a delay time Td caused by the operation delay of the first and second comparison circuits and the RS flip-flop circuit has elapsed from the time when the first voltage V1 reaches the reference voltage Vst or the time when the second voltage V2 reaches the reference voltage Vst.

Therefore, in the oscillation circuit of the related technique, there is a problem that the frequency of the oscillation signal varies as the delay time Td varies with fluctuations in temperature or power supply voltage. That is, there is a problem that the oscillation circuit of the related technique cannot output an oscillation signal having an accurate frequency.

According to one aspect of the present invention, an oscillation circuit includes an RS flip-flop for generating an output signal (oscillation signal) based on a set signal and a reset signal, an electric-charge charge/discharge unit which has first and second capacitors and charges or discharges the first and second capacitors complementarily based on the output signal, a first comparator which compares a first voltage according to electric charge accumulated in the first capacitor and a first reference voltage and outputs the set signal, a second comparator which compares a second voltage according to electric charge accumulated in the second capacitor and the first reference voltage and outputs the reset signal, and a control unit for controlling a timing at which respective voltage levels of the first reference voltage and the first voltage match and a timing at which respective voltage levels of the first reference voltage and the second voltage match in accordance with a frequency of the output signal.

With the above circuit configuration, the oscillation circuit can output an oscillation signal having an accurate frequency.

According to aspects of the invention, it is possible to provide the oscillation circuit that can output an oscillation signal having an accurate frequency.

DETAILED DESCRIPTION

First, a configuration that the present inventors have studied before reaching the present invention will be described before the description of embodiments of the invention.

Figure 30:
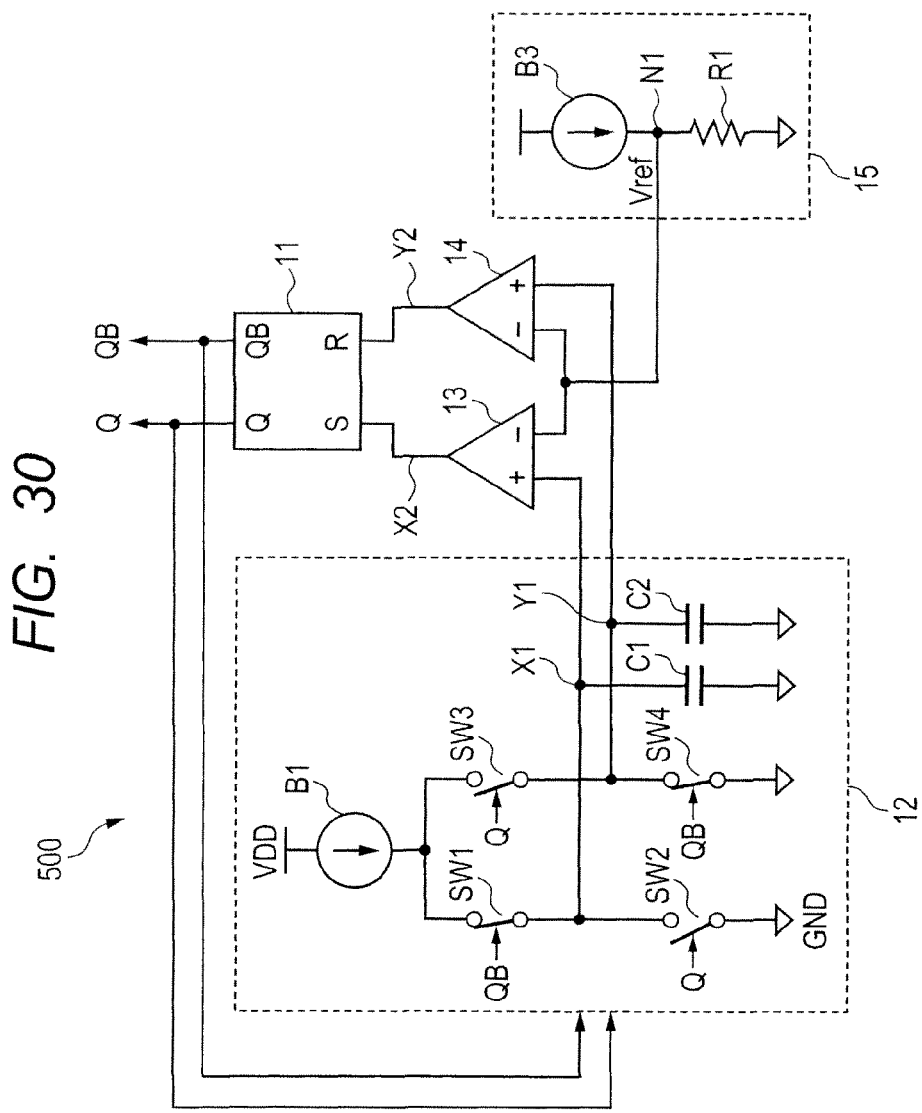
FIG. 30 is a block diagram showing the configuration of an oscillation circuit according to a concept before reaching the present invention.

FIG. 30 is a block diagram showing the configuration of a relaxation oscillation circuit according to a concept before reaching the present invention. The oscillation circuit 500 shown in FIG. 30 includes an RS flip-flop 11, an electric-charge charge/discharge unit 12, a comparator (first comparator) 13, a comparator (second comparator) 14, and a reference voltage generation unit 15.

The RS flip-flop 11 outputs an output signal (hereinafter referred to as an output signal Q) from an output terminal Q, and outputs an inversion signal (hereinafter referred to as an output signal QB) of the output signal Q from an output terminal QB, based on an input signal (comparison result X2 described below) supplied to an input terminal S and an input signal (comparison result Y2 described below) supplied to an input terminal R.

For example, when the input signal supplied to the input terminal S rises while the input signal supplied to the input terminal R is at an L level, the RS flip-flop 11 raises the output signal Q and lowers the output signal QB. On the other hand, when the input signal supplied to the input terminal R rises while the input signal supplied to the input terminal S is at the L level, the RS flip-flop 11 lowers the output signal Q and raises the output signal QB. The RS flip-flop 11 oscillates the output signals Q and QB as the respective input signals supplied to the input terminals R and S rise alternately. The output signals Q and QB are also referred to as oscillation signals.

The electric-charge charge/discharge unit 12 charges or discharges capacitors C1 and C2 complementarily, based on the output signals Q and QB. The electric-charge charge/discharge unit 12 has a constant current source circuit (second constant current source circuit) 31 for feeding a constant current, switches SW1 to SW4, the capacitor (first capacitor) C1, and the capacitor (second capacitor) C2. The switches SW1 to SW4 are collectively referred to as a switch unit. In this example, the capacitors C1 and C2 have substantially the same capacitance value.

In the electric-charge charge/discharge unit 12, the input terminal of the constant current source circuit 31 is coupled to a high-potential-side supply terminal (hereinafter referred to as a power supply voltage terminal VDD) to which a power supply voltage VDD is supplied. The output terminal of the constant current source circuit B1 is coupled to one terminal of the switch SW1 and one terminal of the switch SW3. The other terminal of the switch SW1 is coupled through a node X1 to one terminal of the switch SW2. The other terminal of the switch SW2 is coupled to a low-potential-side supply terminal (hereinafter referred to as a ground voltage terminal GND) to which a ground voltage GND is supplied. Further, the other terminal of the switch SW3 is coupled through a node Y1 to one terminal of the switch SW4. The other terminal of the switch SW4 is coupled to the ground voltage terminal GND. A power source for supplying a voltage to the supply terminal (ground voltage terminal GND in FIG. 30) remote from the constant current source circuit B1 is occasionally referred to as a first power source.

The capacitor C1 is provided in parallel with the switch SW2, between the node X1 and the ground voltage terminal GND. The capacitor C2 is provided in parallel with the switch SW4, between the node Y1 and the ground voltage terminal GND.

The switches SW1 and SW4 are turned on or off based on the output signal QB of the RS flip-flop 11. On the other hand, the switches SW2 and SW3 are turned on or off based on the output signal Q of the RS flip-flop 11.

For example, when the output signal Q is at the L level and the output signal QB is at the H level, the switches SW1 and SW4 are turned on and the switches SW2 and SW3 are turned off. In this case, due to the continuity between the constant current source circuit B1 and one end (node X1) of the capacitor C1, electric charge is gradually accumulated at the one end of the capacitor C1 by the current flowing through the constant current source circuit B1, so that the voltage level (first voltage) of the node X1 gradually rises. Further, due to the continuity between the ground voltage terminal GND and one end (node Y1) of the capacitor C2, electric charge accumulated at the one end of the capacitor C2 is instantly released, so that the voltage level (second voltage) of the node Y1 instantly falls to the ground voltage level (L level).

On the other hand, when the output signal Q is at the H level and the output signal QB is at the L level, the switches SW1 and SW4 are turned off and the switches SW2 and SW3 are turned on. In this case, due to the continuity between the constant current source circuit B1 and the one end (node Y1) of the capacitor C2, electric charge is gradually accumulated at the one end of the capacitor C2 by the current flowing through the constant current source circuit B1, so that the voltage level of the node Y1 gradually rises. Further, due to the continuity between the ground voltage terminal GND and the one end (node X1) of the capacitor C1, electric charge accumulated at the one end of the capacitor C1 is instantly released, so that the voltage level of the node X1 instantly falls to the ground voltage level (L level).

Thus, the capacitors C1 and C2 are charged or discharged complementarily, based on the output signals Q and QB of the RS flip-flop 11.

The reference voltage generation unit 15 generates a reference voltage Vref having a stable voltage level. The reference voltage generation unit 15 has a constant current source circuit (third constant current source circuit) B3 for feeding a constant current and a resistance element (first resistance element) R1.

The constant current source circuit B3 and the resistance element R1 are provided in series between the power supply voltage terminal VDD and the ground voltage terminal GND. More specifically, the power supply voltage terminal VDD is coupled to the input terminal of the constant current source circuit B3. The output terminal of the constant current source circuit B3 is coupled through a node N1 to one end of the resistance element R1. The other end of the resistance element R1 is coupled to the ground voltage terminal GND. The voltage level of the node N1 is determined based on the current value of the current outputted from the constant current source circuit B3 and the resistance value of the resistance element R1. The reference voltage generation unit 15 outputs the voltage (second reference voltage) of the node N1 as the reference voltage Vref.

The comparator 13 compares the reference voltage Vref and the voltage level of the node X1, and outputs a comparison result X2. In the example of FIG. 30, the comparator 13 outputs the comparison result X2 of the H level when the voltage level of the node X1 reaches the reference voltage Vref, and outputs the comparison result X2 of the L level when the voltage level of the node X1 is less than the reference voltage Vref. The voltage (reference voltage Vref in FIG. 30) supplied to the comparator 13 for comparison with the voltage level of the node X1 is occasionally referred to as a first reference voltage.

The comparator 14 compares the reference voltage Vref and the voltage level of the node Y1, and outputs a comparison result Y2. In the example of FIG. 30, the comparator 14 outputs the comparison result Y2 of the H level when the voltage level of the node Y1 reaches the reference voltage Vref, and outputs the comparison result Y2 of the L level when the voltage level of the node Y1 is less than the reference voltage Vref. The voltage (reference voltage Vref in FIG. 30) supplied to the comparator 14 for comparison with the voltage level of the node Y1 is occasionally referred to as the first reference voltage.

For example, when the output signal Q is at the L level and the output signal QB is at the H level, the switches SW1 and SW4 are turned on and the switches SW2 and SW3 are turned off, as described above. Thereby, the capacitor C1 is charged and the voltage level of the node X1 gradually rises. When the voltage level of the node X1 reaches the level of the reference voltage Vref, the comparator 13 raises the comparison result X2 from the L level to the H level. At this time, the capacitor C2 is discharged; therefore, the voltage level of the node Y1 is at the L level less than the reference voltage Vref. Accordingly, the comparator 14 outputs the comparison result Y2 of the L level. Consequently, the RS flip-flop 11 raises the output signal Q and lowers the output signal QB.

Since the output signal Q becomes the H level and the output signal QB becomes the L level, the switches SW1 and SW4 are turned off and the switches SW2 and SW3 are turned on. Thereby, the capacitor C2 is charged and the voltage level of the node Y1 gradually rises. When the voltage level of the node Y1 reaches the level of the reference voltage Vref, the comparator 14 raises the comparison result Y2 from the L level to the H level. At this time, the capacitor C1 is discharged; therefore, the voltage level of the node X1 is at the L level less than the reference voltage Vref. Accordingly, the comparator 13 outputs the comparison result X2 of the L level. Consequently, the RS flip-flop 11 lowers the output signal Q and raises the output signal QB. These operations are repeated.

Thus, the comparison results X2 and Y2 of the comparators 13 and 14 rise alternately. The RS flip-flop 11 oscillates the output signals Q and QB as the respective input signals (comparison results X2 and Y2) supplied to the input terminals R and S rise alternately.

Figure 31:
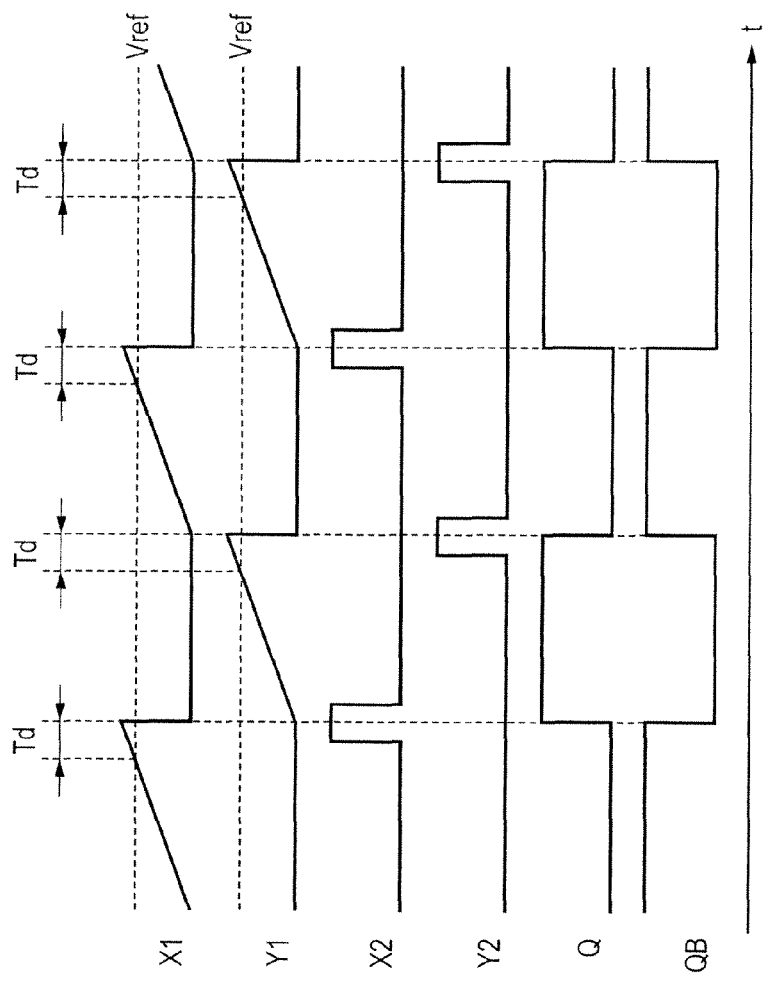
FIG. 31 is a timing chart showing the operation of the oscillation circuit according to the concept before reaching the present invention.

In the oscillation circuit 500 shown in FIG. 30, ideally the logic values of the output signals Q and QB of the RS flip-flop 11 change at the moment when the voltage level of the node X1 reaches the level of the reference voltage Vref or when the voltage level of the node Y1 reaches the level of the reference voltage Vref. However, in reality, the logic values of the output signals Q and QB of the RS flip-flop 11 change after a delay time Td caused by the operation delay of the comparator 13, 14 and the RS flip-flop 11 has elapsed from the time when the voltage level of the node X1 reaches the level the reference voltage Vref or the time when the voltage level of the node Y1 reaches the level of the reference voltage Vref (see FIG. 31).

The change rate (slew rate) of the voltage level of the node X1 or Y1 in an ideal state is expressed as follows.

$$dV/dt = I/C \quad (1)$$

where V denotes the voltage level of the node X1 or Y1, I denotes the current value of the current flowing through the constant current source circuit B1, and C denotes the capacitance value of the capacitor C1 or C2.

Further, the reference voltage Vref is expressed as follows.

$$Vref = R1 \cdot Ib \quad (2)$$

where R1 denotes the resistance value of the resistance element R1, and Ib denotes the current value of the current flowing through the constant current source circuit B3.

Assuming that the current values I and Ib are identical, the pulse width Tp of the output signals Q and QB in an ideal state is expressed as follows.

$$Tp = C \cdot Vref/Ib = R1 \cdot C \quad (3)$$

However, in reality, due to the influence of the operation delay of the comparator 13, 14 and the RS flip-flop 11 as described above, the pulse width Tp of the output signals Q and QB is expressed as follows.

$$Tp = R1 \cdot C + Td \quad (4)$$

Accordingly, in the oscillation circuit 500 shown in FIG. 30, there is a problem that the oscillation frequency of the output signals Q and QB varies as the delay time Td varies with fluctuations in temperature or power supply voltage. That is, there is a problem that the oscillation circuit 500 shown in FIG. 30 cannot output oscillation signals (output signals Q and QB) having an accurate frequency.

Hereinafter, preferred embodiments of the invention will be described with reference to the accompanying drawings. Since the drawings are presented as merely illustrative, the technical scope of the invention should not be interpreted restrictively on the basis of the drawings. The same components are denoted by the same reference numerals, and their description will not be repeated.

First Embodiment

Figure 1:
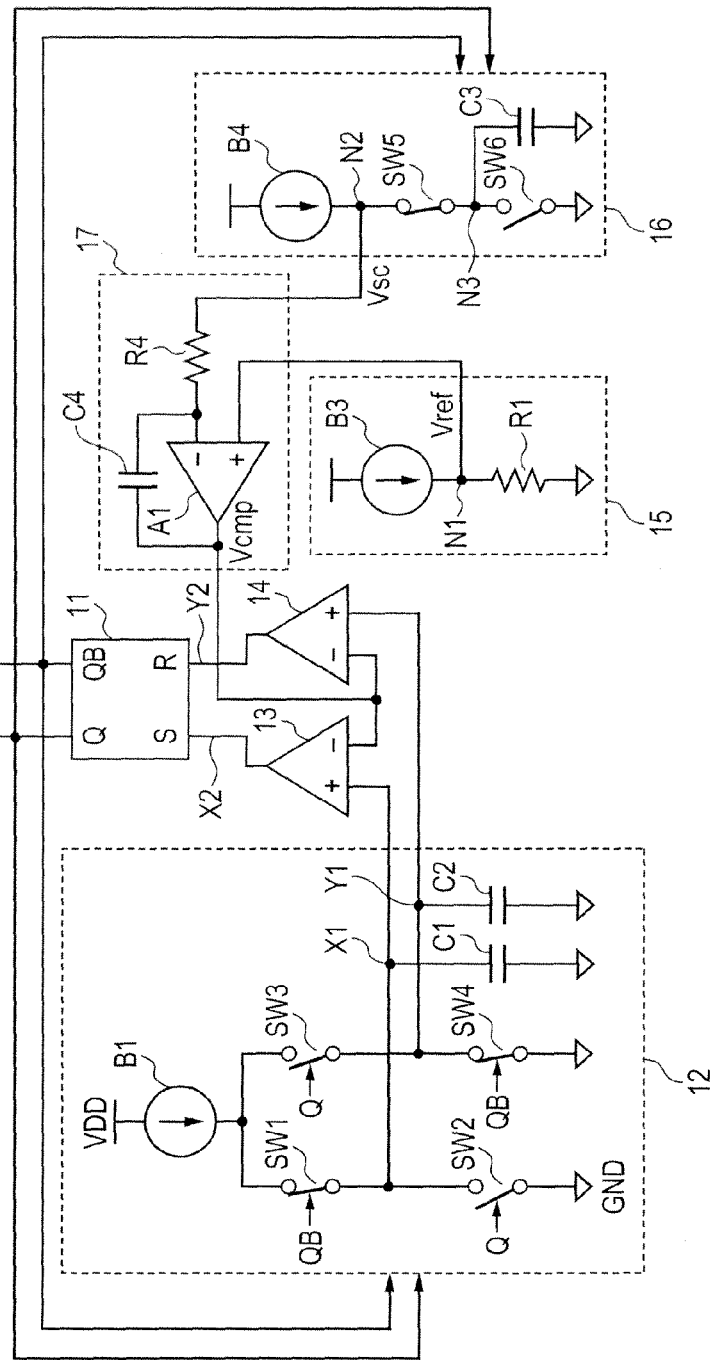
FIG. 1 is a block diagram showing the configuration of an oscillation circuit according to a first embodiment of the invention.
Figure 2:
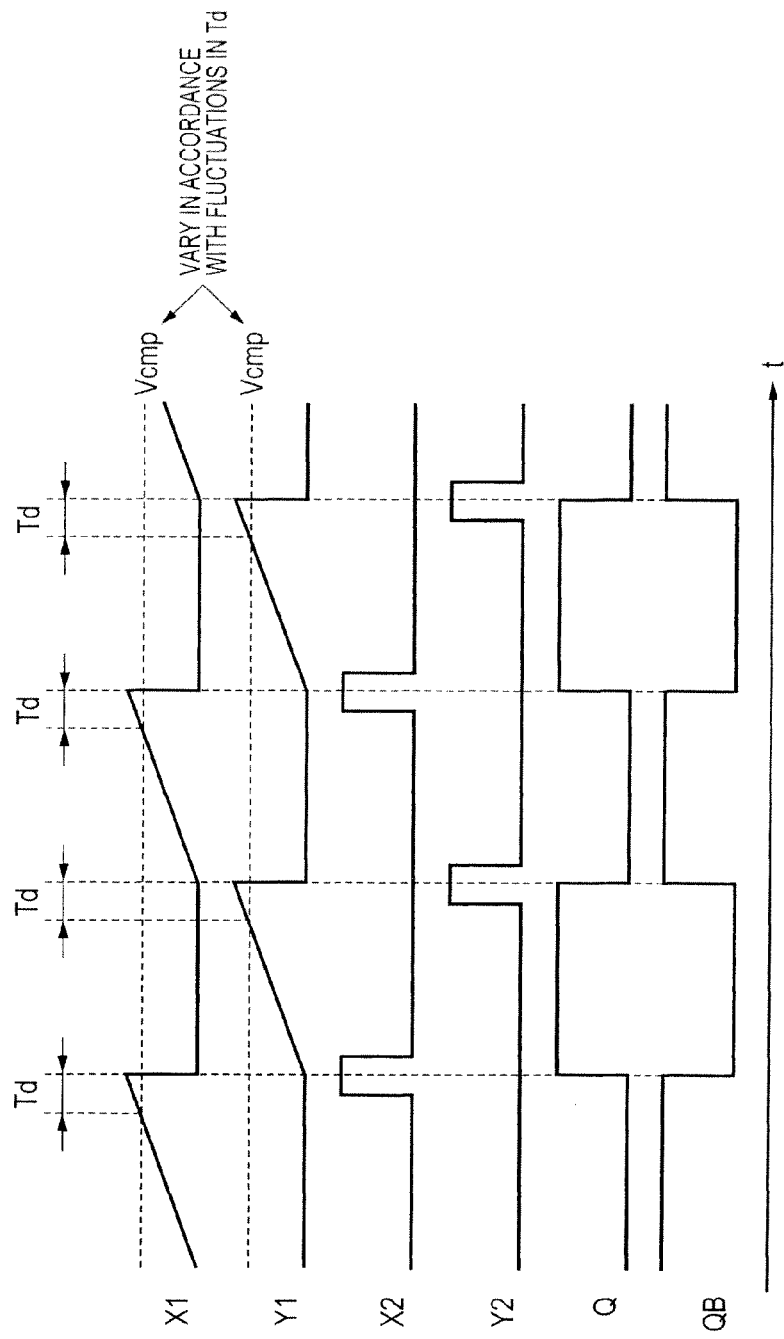
FIG. 2 is a timing chart showing the operation of the oscillation circuit according to the first embodiment of the invention.

FIG. 1 is a block diagram showing the configuration of an oscillation circuit 1 according to a first embodiment of the invention. FIG. 2 is a timing chart showing the operation of the oscillation circuit 1 according to the first embodiment of the invention. The oscillation circuit 1 according to this embodiment can output oscillation signals (output signals Q and QB) having an accurate frequency even with fluctuations in temperature or power supply voltage. Hereinafter, the oscillation circuit 1 will be described with reference to FIGS. 1 and 2.

The oscillation circuit 1 shown in FIG. 1 includes the RS flip-flop 11, the electric-charge charge/discharge unit 12, the comparator (first comparator) 13, the comparator (second comparator) 14, the reference voltage generation unit 15, a control voltage generation unit 16, and a comparison voltage generation unit (voltage control unit) 17. That is, in comparison with the oscillation circuit 500 shown in FIG. 30, the oscillation circuit 1 shown in FIG. 1 further includes the control voltage generation unit 16 and the comparison voltage generation unit 17. The control voltage generation unit 16 and the comparison voltage generation unit 17 are collectively referred to as a control unit. Hereinafter, points different from the oscillation circuit 500 shown in FIG. 30 will be mainly described.

The control voltage generation unit 16 generates a control voltage Vsc having a voltage level according to the frequency of the output signals Q and QB of the RS flip-flop 11. The control voltage generation unit 16 has a constant current source circuit (first constant current source circuit) B4 for feeding a constant current, a switch SW5, a switch SW6, and a capacitor C3.

The constant current source circuit B4 and the switches SW5 and SW6 are provided in series between the power supply voltage terminal VDD and the ground voltage terminal GND. More specifically, the power supply voltage terminal VDD is coupled to the input terminal of the constant current source circuit B4. The output terminal of the constant current source circuit B4 is coupled through a node N2 to one terminal of the switch SW5. The other terminal of the switch SW5 is coupled through a node N3 to one terminal of the switch SW6. The other terminal of the switch SW6 is coupled to the ground voltage terminal GND. The capacitor C3 is provided in parallel with the switch SW6, between the node N3 and the ground voltage terminal GND. That is, the control voltage generation unit 16 is a so-called switched capacitor.

The switch SW5 is turned on or off, for example, based on the output signal Q of the RS flip-flop 11. On the other hand, the switch SW6 is turned on or off, for example, based on the output signal QB of the RS flip-flop 11. That is, the switches SW5 and SW6 are turned on or off complementarily.

For example, when the output signal Q is at the H level and the output signal QB is at the L level, the switch SW5 is turned on and the switch SW6 is turned off. In this case, due to the continuity between the constant current source circuit B4 and one end (node N3) of the capacitor C3, electric charge outputted from the constant current source circuit B4 is accumulated at the one end of the capacitor C3, so that the voltage level of the node N2 rises. On the other hand, when the output signal Q is at the L level and the output signal QB is at the H level, the switch SW5 is turned off and the switch SW6 is turned on. In this case, due to the continuity between the ground voltage terminal GND and the one end of the capacitor C3, electric charge accumulated at the one end of the capacitor C3 is released, so that the voltage level of the node N2 falls.

Thus, the switches SW5 and SW6 are turned on and off at high speed with the oscillation period of the output signals Q and QB, thereby forming a pseudo resistance element. The resistance value Rd of the pseudo resistance element is expressed as follows.

$$Rd = 1/(f \cdot C3) \quad (5)$$

where f denotes the frequency of the output signals Q and QB, and C3 denotes the capacitance value of the capacitor C3.

As is obvious from equation (5), the resistance value Rd of the pseudo resistance element decreases as the frequency f of the output signals Q and QB increases, and the resistance value Rd of the pseudo resistance element increases as the frequency f of the output signals Q and QB decreases. The voltage level of the node N2 is determined based on the current value of the current outputted from the constant current source circuit B4 and the resistance value Rd of the pseudo resistance element.

Therefore, the voltage level of the node N2 decreases as the frequency f of the output signals Q and QB increases, and the voltage level of the node N2 increases as the frequency f of the output signals Q and QB decreases. The control voltage generation unit 16 outputs the voltage of the node N2 as the control voltage Vsc. That is, the control voltage generation unit 16 generates the control voltage Vsc whose voltage level decreases as the frequency f of the output signals Q and QB increases and increases as the frequency f of the output signals Q and QB decreases.

The comparison voltage generation unit 17 generates a comparison voltage Vcmp according to the difference between the control voltage Vsc and the reference voltage Vref. The comparison voltage generation unit 17 has an operational amplifier A1, a resistance element R4, and a capacitor C4.

One end of the resistance element R4 is coupled to the node N2 of the control voltage generation unit 16, and the other end of the resistance element R4 is coupled to the inverting input terminal of the operational amplifier A1. That is, the control voltage Vsc from the control voltage generation unit 16 is supplied through the resistance element R4 to the inverting input terminal of the operational amplifier A1. A current proportional to the difference between the control voltage Vsc and the reference voltage Vref flows through the resistance element R4. Further, the reference voltage Vref from the reference voltage generation unit 15 is supplied to the non-inverting input terminal of the operational amplifier A1. The capacitor C4 is provided between the inverting input terminal and the output terminal of the operational amplifier A1. The operational amplifier A1 outputs the comparison voltage Vcmp from the output terminal. The comparison voltage generation unit 17 feeds back a portion of the output of the operational amplifier A1 to the input side so that the voltage level of the inverting input terminal of the operational amplifier A1 becomes equal to the voltage level of the non-inverting input terminal of the operational amplifier A1. That is, the comparison voltage generation unit 17 is a so-called integration circuit.

With this configuration, the comparison voltage generation unit 17 generates the comparison voltage Vcmp according to the difference between the average value of the control voltage Vsc and the reference voltage Vref.

The voltage level of the comparison voltage Vcmp decreases as the control voltage Vsc becomes higher than the reference voltage Vref, and the voltage level of the comparison voltage Vcmp increases as the control voltage Vsc becomes lower than the reference voltage Vref. Accordingly, for example, the capacitance value of the capacitor C3 in the control voltage generation unit 16 is adjusted beforehand so that the output signals Q and QB have a desired frequency when the control voltage Vsc becomes substantially the same voltage level as the reference voltage Vref.

Therefore, for example, when the frequency of the output signals Q and QB becomes higher than the desired frequency, the control voltage Vsc becomes lower than the reference voltage Vref, so that the comparison voltage Vcmp becomes higher. On the other hand, when the frequency of the output signals Q and QB becomes lower than the desired frequency, the control voltage Vsc becomes higher than the reference voltage Vref, so that the comparison voltage Vcmp becomes lower. When the frequency of the output signals Q and QB becomes equal to the desired frequency, the control voltage Vsc becomes substantially the same voltage level as the reference voltage Vref.

In FIG. 1, the comparison voltage Vcmp in place of the reference voltage Vref is supplied to the inverting input terminals of the comparators 13 and 14. That is, the comparator 13 compares the comparison voltage Vcmp and the voltage level of the node X1, and outputs the comparison result X2. The comparator 14 compares the comparison voltage Vcmp and the voltage level of the node Y1, and outputs the comparison result Y2. The voltage (comparison voltage Vcmp in FIG. 1) supplied to the comparators 13 and 14 for comparison with the voltage levels of the nodes X1 and Y1 is occasionally referred to as the first reference voltage.

Consequently, when the frequency of the output signals Q and QB becomes higher than the desired frequency and the comparison voltage Vcmp becomes higher, the time until the voltage levels of the nodes X1 and Y1 reach the comparison voltage Vcmp increases comparatively, so that the frequency of the output signals Q and QB decreases. On the other hand, when the frequency of the output signals Q and QB becomes lower than the desired frequency and the comparison voltage Vcmp becomes lower, the time until the voltage levels of the nodes X1 and Y1 reach the comparison voltage Vcmp decreases comparatively, so that the frequency of the output signals Q and QB increases. When the frequency of the output signals Q and QB is equal to the desired frequency, that is, the control voltage Vsc is substantially the same voltage level as the reference voltage Vref, the frequency of the output signals Q and QB maintains the desired frequency.

Thus, the oscillation circuit 1 according to this embodiment, when the frequency of the output signals Q and QB is higher than the desired frequency, increases the comparison voltage Vcmp and thereby decreases the frequency of the output signals Q and QB. On the other hand, the oscillation circuit 1 according to this embodiment, when the frequency of the output signals Q and QB is lower than the desired frequency, decreases the comparison voltage Vcmp and thereby increases the frequency of the output signals Q and QB. That is, the oscillation circuit 1 according to this embodiment generates the comparison voltage Vcmp according to the frequency of the output signals Q and QB, and thereby controls the timing at which the voltage level of the node X1 becomes equal to the voltage level of the comparison voltage Vcmp and the timing at which the voltage level of the node Y1 becomes equal to the voltage level of the comparison voltage Vcmp. Accordingly, the oscillation circuit 1 according to this embodiment can accurately output the output signals (oscillation signals) Q and QB having the desired frequency even when the delay time Td caused by the operation delay of the comparator and the RS flip-flop varies with fluctuations in temperature or power supply voltage.

Second Embodiment

Figure 3:
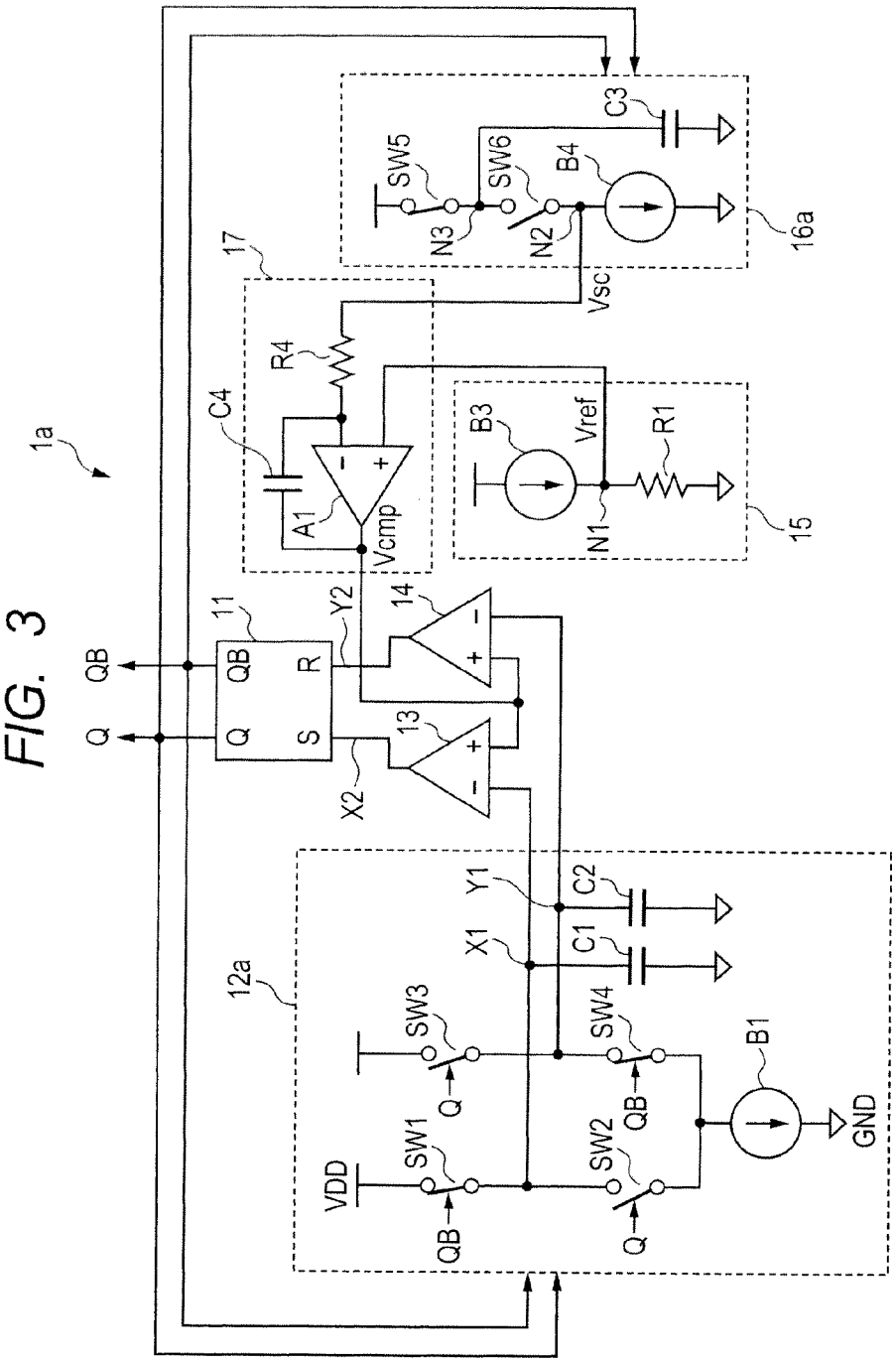
FIG. 3 is a block diagram showing the configuration of an oscillation circuit according to a second embodiment of the invention.

FIG. 3 is a block diagram showing the configuration of an oscillation circuit 1a according to a second embodiment of the invention. In comparison with the oscillation circuit 1 shown in FIG. 1, the oscillation circuit 1a shown in FIG. 3 includes an electric-charge charge/discharge unit 12a in place of the electric-charge charge/discharge unit 12 and a control voltage generation unit 16a in place of the control voltage generation unit 16. Further, in the oscillation circuit 1a shown in FIG. 3, unlike the oscillation circuit 1 shown in FIG. 1, the voltages of the nodes X1 and Y1 are supplied to the inverting input terminals of the comparators 13 and 14 respectively, and the comparison voltage Vcmp is supplied to the non-inverting input terminals of the comparators 13 and 14.

In the electric-charge charge/discharge unit 12a, the constant current source circuit B1 is provided on the ground voltage terminal GND side. More specifically, the power supply voltage terminal VDD is coupled to one terminal of the switch SW1 and one terminal of the switch SW3. The other terminal of the switch SW1 is coupled through the node X1 to one terminal of the switch SW2. The other terminal of the switch SW2 is coupled to the input terminal of the constant current source circuit B1. Further, the other terminal of the switch SW3 is coupled through the node Y1 to one terminal of the switch SW4. The other terminal of the switch SW4 together with the other terminal of the switch SW2 is coupled to the input terminal of the constant current source circuit B1. The output terminal of the constant current source circuit B1 is coupled to the ground voltage terminal GND. The coupling relationship between the capacitors C1 and C2 is the same as in FIG. 1, and will not be described again. A power source for supplying a voltage to the supply terminal (power supply voltage terminal VDD in FIG. 3) remote from the constant current source circuit B1 is occasionally referred to as a first power source.

In the control voltage generation unit 16a, the constant current source circuit B4 is provided on the ground voltage terminal GND side. More specifically, the power supply voltage terminal VDD is coupled to one terminal of the switch SW5. The other terminal of the switch SW5 is coupled through the node N3 to one terminal of the switch SW6. The other terminal of the switch SW6 is coupled through the node N2 to the input terminal of the constant current source circuit B4. The output terminal of the constant current source circuit B4 is coupled to the ground voltage terminal GND. The capacitor C3 is provided between the node N3 and the ground voltage terminal GND.

As described above, the resistance value Rd of the pseudo resistance element decreases as the frequency f of the output signals Q and QB increases, and the resistance value Rd of the pseudo resistance element increases as the frequency f of the output signals Q and QB decreases. The voltage level of the node N2 is determined based on the current value of the current outputted from the constant current source circuit B4 and the resistance value Rd of the pseudo resistance element.

Therefore, the voltage level of the node N2 increases as the frequency f of the output signals Q and QB increases, and the voltage level of the node N2 decreases as the frequency f of the output signals Q and QB decreases. The control voltage generation unit 16a outputs the voltage of the node N2 as the control voltage Vsc. That is, the control voltage generation unit 16a generates the control voltage Vsc whose voltage level increases as the frequency f of the output signals Q and QB increases and decreases as the frequency f of the output signals Q and QB decreases.

Therefore, for example, when the frequency of the output signals Q and QB becomes higher than the desired frequency, the control voltage Vsc becomes higher than the reference voltage Vref, so that the comparison voltage Vcmp becomes lower. On the other hand, when the frequency of the output signals Q and QB becomes lower than the desired frequency, the control voltage Vsc becomes lower than the reference voltage Vref, so that the comparison voltage Vcmp becomes higher. When the frequency of the output signals Q and QB becomes equal to the desired frequency, the control voltage Vsc becomes substantially the same voltage level as the reference voltage Vref. The remaining circuit configuration and operation of the oscillation circuit 1a shown in FIG. 3 are the same as those of the oscillation circuit 1 shown in FIG. 1, and will not be described again.

Figure 4:
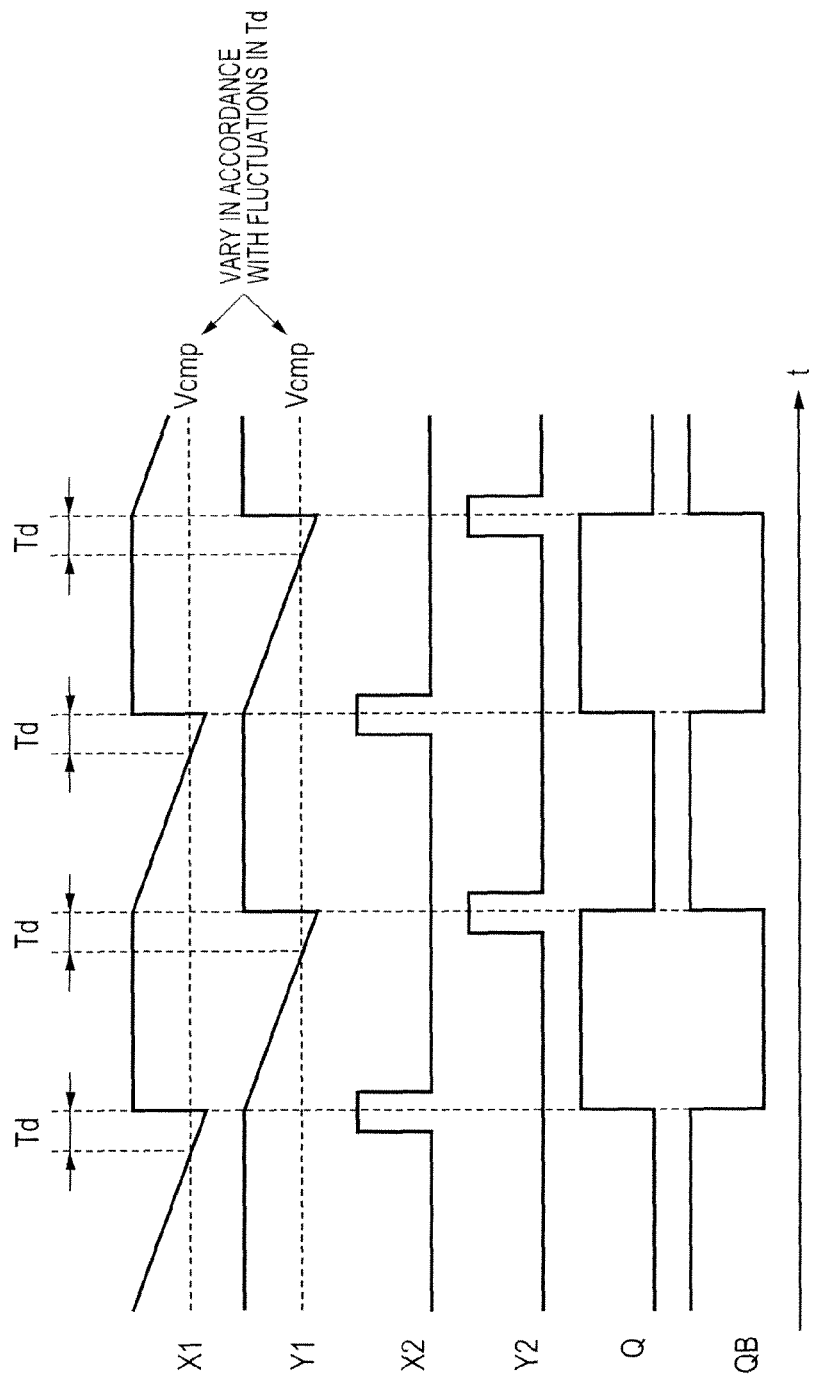
FIG. 4 is a timing chart showing the operation of the oscillation circuit according to the second embodiment of the invention.

FIG. 4 is a timing chart showing the operation of the oscillation circuit 1a. For example, when the output signal Q is at the L level and the output signal QB is at the H level, the switches SW1 and SW4 are turned on and the switches SW2 and SW3 are turned off. In this case, due to the continuity between the power supply voltage terminal VDD and one end (node X1) of the capacitor C1, electric charge from the power supply voltage terminal VDD is instantly accumulated at the one end of the capacitor C1, so that the voltage level of the node X1 instantly rises to the power supply voltage level (H level). Further, due to the continuity between the constant current source circuit B1 and one end (node Y1) of the capacitor C2, electric charge accumulated at the one end of the capacitor C2 is gradually released by the current flowing through the constant current source circuit B1, so that the voltage level of the node Y1 gradually falls.

On the other hand, when the output signal Q is at the H level and the output signal QB is at the L level, the switches SW1 and SW4 are turned off and the switches SW2 and SW3 are turned on. In this case, due to the continuity between the power supply voltage terminal VDD and the one end (node Y1) of the capacitor C2, electric charge from the power supply voltage terminal VDD is instantly accumulated at the one end of the capacitor C2, so that the voltage level of the node Y1 instantly rises to the power supply voltage level (H level). Further, due to the continuity between the constant current source circuit B1 and the one end (node X1) of the capacitor C1, electric charge accumulated at the one end of the capacitor C1 is gradually released by the current flowing through the constant current source circuit B1, so that the voltage level of the node X1 gradually falls.

The comparator 13 outputs the comparison result X2 of the H level when the voltage level of the node X1 falls and reaches the level of the comparison voltage Vcmp, and outputs the comparison result X2 of the L level when the voltage level of the node X1 is higher than the comparison voltage Vcmp. The comparator 14 outputs the comparison result Y2 of the H level when the voltage level of the node Y1 falls and reaches the level of the comparison voltage Vcmp, and outputs the comparison result Y2 of the L level when the voltage level of the node Y1 is higher than the comparison voltage Vcmp.

Consequently, when the frequency of the output signals Q and QB becomes higher than the desired frequency and the comparison voltage Vcmp becomes lower, the time until the voltage levels of the nodes X1 and Y1 fall and reach the comparison voltage Vcmp increases comparatively, so that the frequency of the output signals Q and QB decreases. On the other hand, when the frequency of the output signals Q and QB becomes lower than the desired frequency and the comparison voltage Vcmp becomes higher, the time until the voltage levels of the nodes X1 and Y1 fall and reach the comparison voltage Vcmp decreases comparatively, so that the frequency of the output signals Q and QB increases. When the frequency of the output signals Q and QB is equal to the desired frequency, that is, the control voltage Vsc is substantially the same voltage level as the reference voltage Vref, the frequency of the output signals Q and QB maintains the desired frequency.

With this circuit configuration, the oscillation circuit 1a shown in FIG. 3 can provide the same effect as the oscillation circuit 1 shown in FIG. 1. In the following embodiments as well, this change in circuit configuration can be made as appropriate without departing from the spirit and scope of the invention.

Third Embodiment

Figure 5:
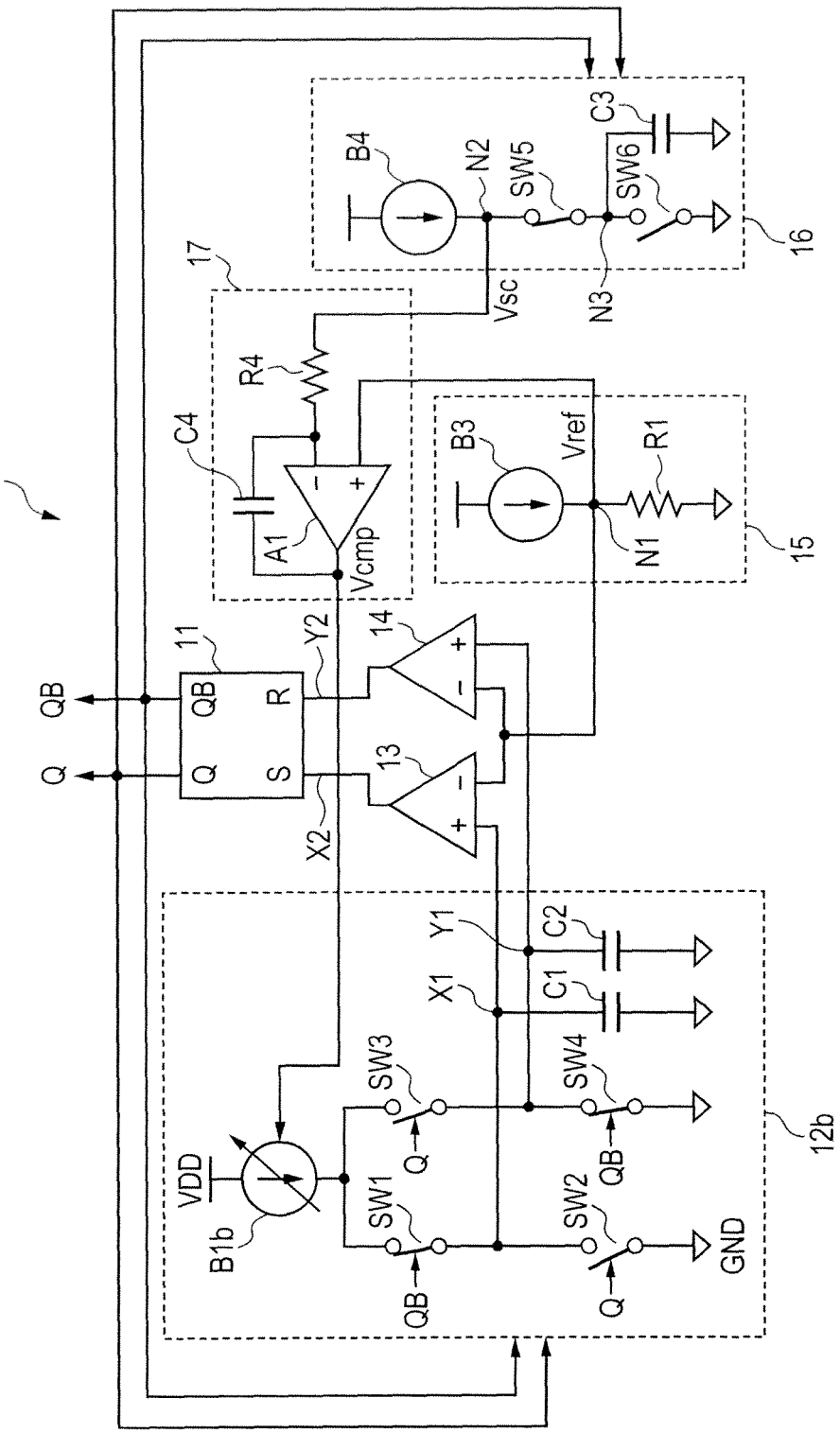
FIG. 5 is a block diagram showing the configuration of an oscillation circuit according to a third embodiment of the invention.
Figure 6:
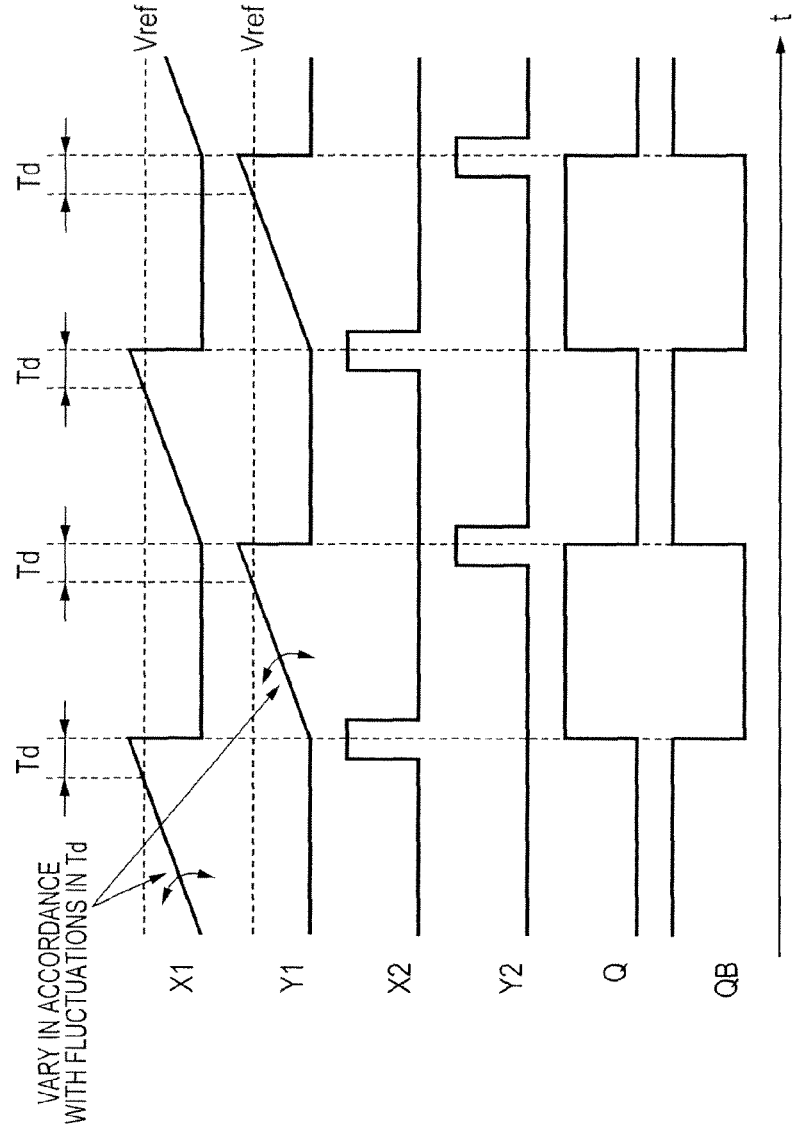
FIG. 6 is a timing chart showing the operation of the oscillation circuit according to the third embodiment of the invention.

FIG. 5 is a block diagram showing the configuration of an oscillation circuit 1b according to a third embodiment of the invention. FIG. 6 is a timing chart showing the operation of the oscillation circuit 1b according to the third embodiment of the invention. In comparison with the oscillation circuit 1 shown in FIG. 1, the oscillation circuit 1b shown in FIG. 5 includes an electric-charge charge/discharge unit 12b in place of the electric-charge charge/discharge unit 12. Further, in the oscillation circuit 1b shown in FIG. 5, unlike the oscillation circuit 1 shown in FIG. 1, the reference voltage Vref is supplied to the inverting input terminals of the comparators 13 and 14. Therefore, the comparators 13 and 14 compare the voltages of the nodes X1, Y1 and the constant reference voltage Vref, respectively. Further, the comparison voltage Vcmp generated by the comparison voltage generation unit 17 is supplied to the electric-charge charge/discharge unit 12b. Hereinafter, the oscillation circuit 1b will be described with reference to FIGS. 5 and 6.

In comparison with the electric-charge charge/discharge unit 12, the electric-charge charge/discharge unit 12b has a variable current source circuit B1b in place of the constant current source circuit B1. The variable current source circuit B1b feeds a current according to the comparison voltage Vcmp. For example, the current flowing through the variable current source circuit B1b decreases as the comparison voltage Vcmp increases, and increases as the comparison voltage Vcmp decreases.

For example, when the frequency of the output signals Q and QB becomes higher than the desired frequency and the control voltage Vsc becomes lower than the reference voltage Vref, the current flowing through the variable current source circuit B1b decreases. This decreases the charging rate of the capacitors C1 and C2; therefore, the time until the voltage levels of the nodes X1 and Y1 reach the level of the reference voltage Vref increases comparatively, so that the frequency of the output signals Q and QB decreases. On the other hand, when the frequency of the output signals Q and QB becomes lower than the desired frequency and the control voltage Vsc becomes higher than the reference voltage Vref, the current flowing through the variable current source circuit B1b increases. This increases the charging rate of the capacitors C1 and C2; therefore, the time until the voltage levels of the nodes X1 and Y1 reach the level of the reference voltage Vref decreases comparatively, so that the frequency of the output signals Q and QB increases. When the frequency of the output signals Q and QB is equal to the desired frequency, that is, the control voltage Vsc is substantially the same voltage level as the reference voltage Vref, the frequency of the output signals Q and QB maintains the desired frequency.

Thus, the oscillation circuit 1b according to this embodiment, when the frequency of the output signals Q and QB is higher than the desired frequency, decreases the current flowing through the variable current source circuit B1b and decreases the rise rate (slew rate) of the voltage levels of the nodes X1 and Y1, thereby decreasing the frequency of the output signals Q and QB. On the other hand, the oscillation circuit 1b according to this embodiment, when the frequency of the output signals Q and QB is lower than the desired frequency, increases the current flowing through the variable current source circuit B1b and increases the rise rate (slew rate) of the voltage levels of the nodes X1 and Y1, thereby increasing the frequency of the output signals Q and QB. That is, the oscillation circuit 1b according to this embodiment causes the variable current source circuit B1b to feed the current according to the frequency of the output signals Q and QB, and thereby controls the timing at which the voltage level of the node X1 becomes equal to the voltage level of the reference voltage Vref and the timing at which the voltage level of the node Y1 becomes equal to the voltage level of the reference voltage Vref. Accordingly, the oscillation circuit 1b according to this embodiment can accurately output the output signals (oscillation signals) Q and QB having the desired frequency even when the delay time Td caused by the operation delay of the comparator and the RS flip-flop varies with fluctuations in temperature or power supply voltage.

Fourth Embodiment

Figure 7:
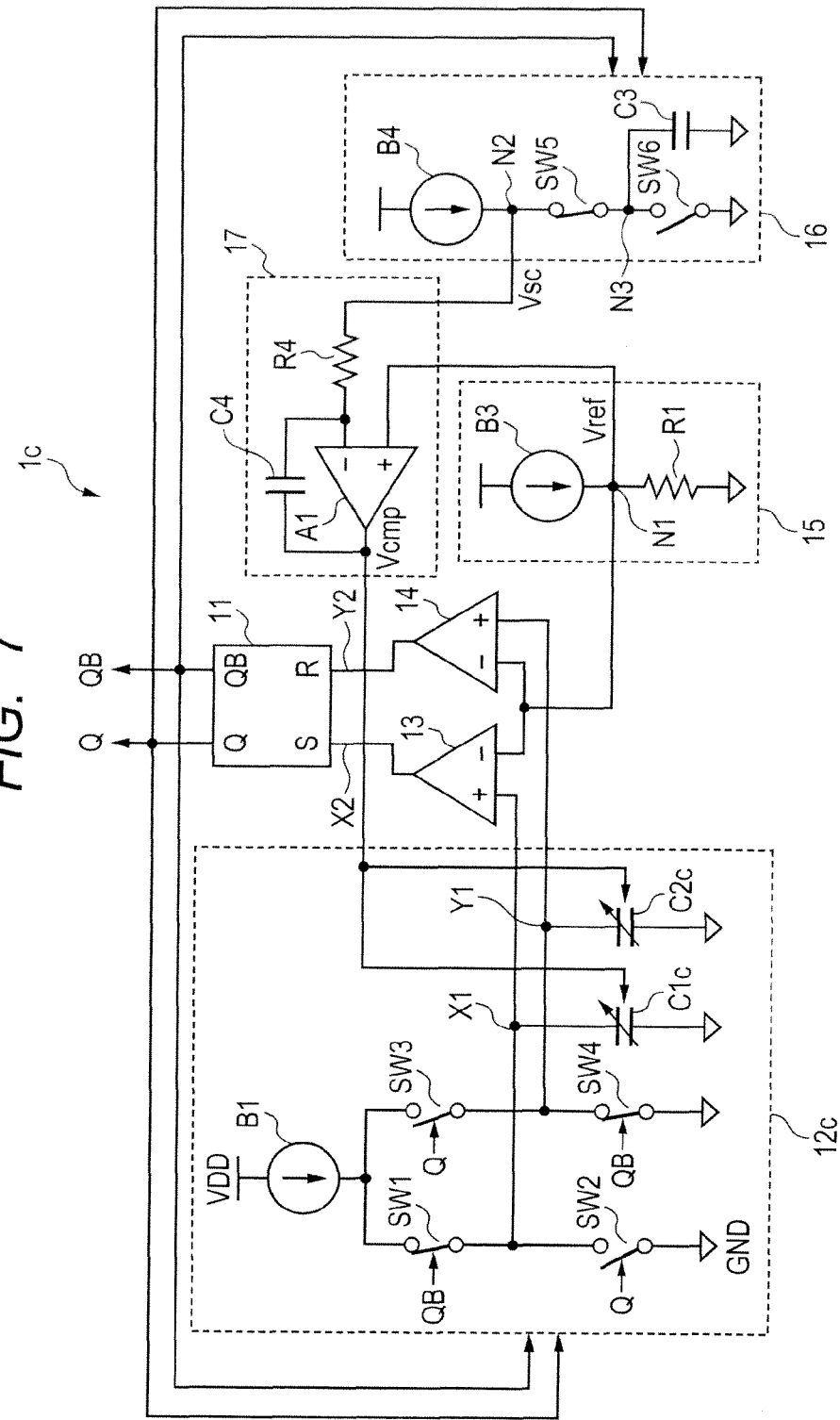
FIG. 7 is a block diagram showing the configuration of an oscillation circuit according to a fourth embodiment of the invention.

FIG. 7 is a block diagram showing the configuration of an oscillation circuit 1c according to a fourth embodiment of the invention. In comparison with the oscillation circuit 1 shown in FIG. 1, the oscillation circuit 1c shown in FIG. 7 includes an electric-charge charge/discharge unit 12c in place of the electric-charge charge/discharge unit 12. Further, in the oscillation circuit 1c shown in FIG. 7, unlike the oscillation circuit 1 shown in FIG. 1, the reference voltage Vref is supplied to the inverting input terminals of the comparators 13 and 14. Therefore, the comparators 13 and 14 compare the voltages of the nodes X1, Y1 and the constant reference voltage Vref, respectively. Further, the comparison voltage Vcmp generated by the comparison voltage generation unit 17 is supplied to the electric-charge charge/discharge unit 12c.

In comparison with the electric-charge charge/discharge unit 12, the electric-charge charge/discharge unit 12c has variable capacitors C1c and C2c in place of the capacitors C1 and C2. The variable capacitors C1c and C2c have variable capacitance values according to the comparison voltage Vcmp. For example, the capacitances of the variable capacitors C1c and C2c increase as the comparison voltage Vcmp increases, and decrease as the comparison voltage Vcmp decreases.

For example, when the frequency of the output signals Q and QB becomes higher than the desired frequency and the control voltage Vsc becomes lower than the reference voltage Vref, the capacitance values of the variable capacitors C1c and C2c increase. Accordingly, the time until the voltage levels of the nodes X1 and Y1 reach the level of the reference voltage Vref increases comparatively, so that the frequency of the output signals Q and QB decreases. On the other hand, when the frequency of the output signals Q and QB becomes lower than the desired frequency and the control voltage Vsc becomes higher than the reference voltage Vref, the capacitance values of the variable capacitors C1c and C2c decrease. Accordingly, the time until the voltage levels of the nodes X1 and Y1 reach the level of the reference voltage Vref decreases comparatively, so that the frequency of the output signals Q and QB increases. When the frequency of the output signals Q and QB is equal to the desired frequency, that is, the control voltage Vsc is substantially the same voltage level as the reference voltage Vref, the frequency of the output signals Q and QB maintains the desired frequency.

Thus, the oscillation circuit 1c according to this embodiment, when the frequency of the output signals Q and QB is higher than the desired frequency, increases the capacitance values of the variable capacitors C1c and C2c and decreases the rise rate (slew rate) of the voltage levels of the nodes X1 and Y1, thereby decreasing the frequency of the output signals Q and QB. On the other hand, the oscillation circuit 1c according to this embodiment, when the frequency of the output signals Q and QB is lower than the desired frequency, decreases the capacitance values of the variable capacitors C1c and C2c and increases the rise rate (slew rate) of the voltage levels of the nodes X1 and Y1, thereby increasing the frequency of the output signals Q and QB. That is, the oscillation circuit 1c according to this embodiment controls the capacitance values of the variable capacitors C1c and C2c in accordance with the frequency of the output signals Q and QB, and thereby controls the timing at which the voltage level of the node X1 becomes equal to the voltage level of the reference voltage Vref and the timing at which the voltage level of the node Y1 becomes equal to the voltage level of the reference voltage Vref. Accordingly, the oscillation circuit 1c according to this embodiment can accurately output the output signals (oscillation signals) Q and QB having the desired frequency even when the delay time Td caused by the operation delay of the comparator and the RS flip-flop varies with fluctuations in temperature or power supply voltage.

Fifth Embodiment

Figure 8:
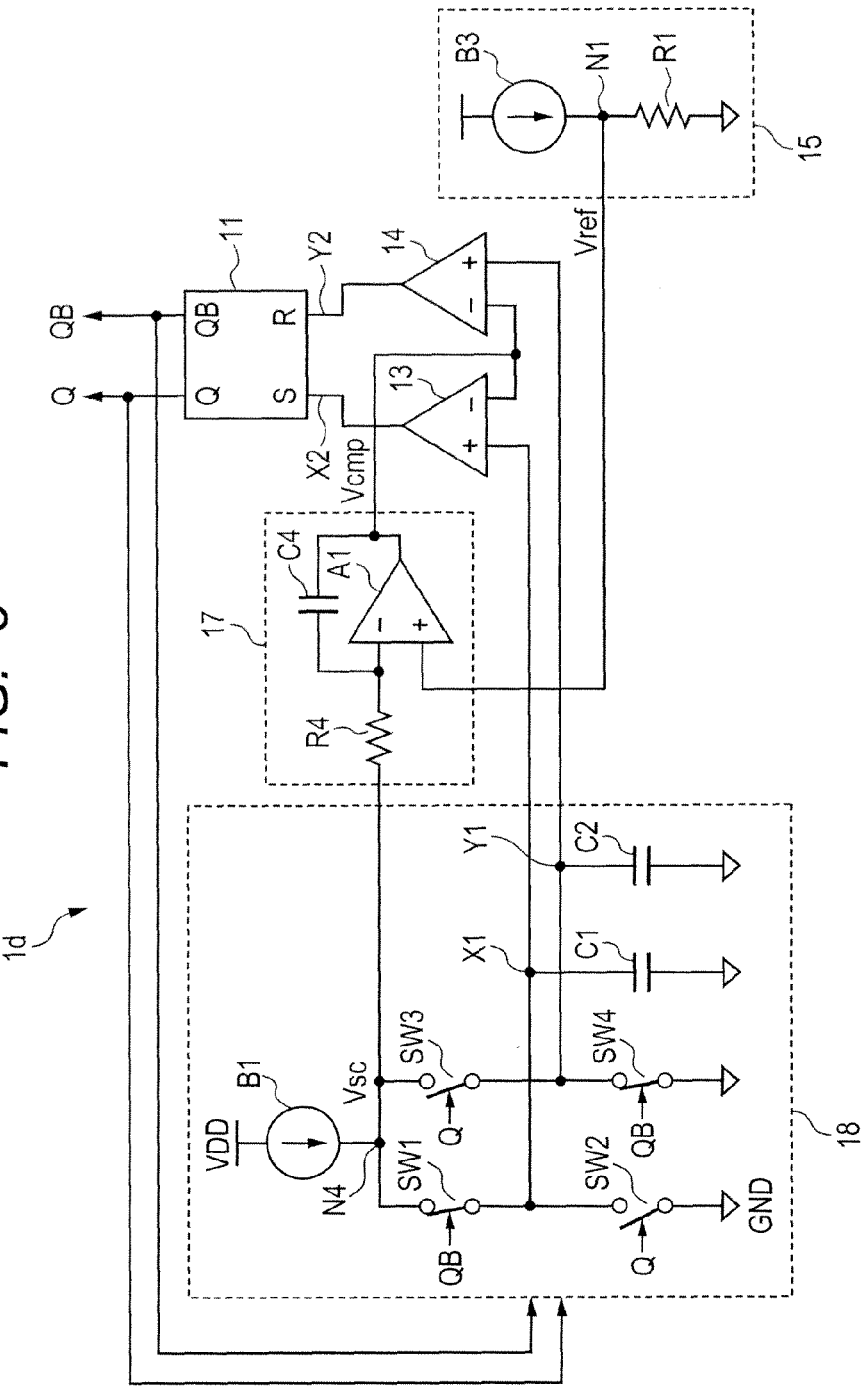
FIG. 8 is a block diagram showing the configuration of an oscillation circuit according to a fifth embodiment of the invention.

FIG. 8 is a block diagram showing the configuration of an oscillation circuit 1d according to a fifth embodiment of the invention. In comparison with the oscillation circuit 1 shown in FIG. 1, the oscillation circuit 1d shown in FIG. 8 includes one electric-charge charge/discharge and control voltage generation unit 18 in place of the electric-charge charge/discharge unit 12 and the control voltage generation unit 16. The electric-charge charge/discharge and control voltage generation unit 18 has the respective functions of the electric-charge charge/discharge unit 12 and the control voltage generation unit 16.

The electric-charge charge/discharge and control voltage generation unit 18 charges or discharges the capacitors C1 and C2 complementarily based on the output signals Q and QB, and generates the control voltage Vsc having a voltage level according to the frequency of the output signals Q and QB.

The electric-charge charge/discharge and control voltage generation unit 18 has the constant current source circuit B1 for feeding a constant current, the switches SW1 to SW4, and the capacitors C1 and C2.

The power supply voltage terminal VDD is coupled to the input terminal of the constant current source circuit B1. The output terminal of the constant current source circuit B1 is coupled through a node N4 to one terminal of the switch SW1 and one terminal of the switch SW3. The other terminal of the switch SW1 is coupled through the node X1 to one terminal of the switch SW2. The other terminal of the switch SW2 is coupled to the ground voltage terminal GND. The other terminal of the switch SW3 is coupled through the node Y1 to one terminal of the switch SW4. The other terminal of the switch SW4 is coupled to the ground voltage terminal GND.

The capacitor C1 is provided in parallel with the switch SW2, between the node X1 and the ground voltage terminal GND. The capacitor C2 is provided in parallel with the switch SW4, between the node Y1 and the ground voltage terminal GND.

In the electric-charge charge/discharge and control voltage generation unit 18, the constant current source circuit B1 corresponds to the constant current source circuit B4 in the control voltage generation unit 16, the switches SW1 and SW3 correspond to the switch SW5 in the control voltage generation unit 16, the switches SW2 and SW4 correspond to the switch SW6 in the control voltage generation unit 16, and the capacitors C1 and C2 correspond to the capacitor C3 in the control voltage generation unit 16. The electric-charge charge/discharge and control voltage generation unit 18 outputs the voltage of the node N4 as the control voltage Vsc.

Similarly, in the electric-charge charge/discharge and control voltage generation unit 18, the constant current source circuit B1 corresponds to the constant current source circuit B1 in the electric-charge charge/discharge unit 12, the switches SW1 to SW4 correspond to the switches SW1 to SW4 in the electric-charge charge/discharge unit 12, and the capacitors C1 and C2 correspond to the capacitors C1 and C2 in the electric-charge charge/discharge unit 12.

The operation of the electric-charge charge/discharge and control voltage generation unit 18 is the same as those of the electric-charge charge/discharge unit 12 and the control voltage generation unit 16, and will not be described again.

Thus, the oscillation circuit 1d according to this embodiment, when the frequency of the output signals Q and QB is higher than the desired frequency, increases the comparison voltage Vcmp and thereby decreases the frequency of the output signals Q and QB. On the other hand, the oscillation circuit 1d according to this embodiment, when the frequency of the output signals Q and QB is lower than the desired frequency, decreases the comparison voltage Vcmp and thereby increases the frequency of the output signals Q and QB. Accordingly, the oscillation circuit 1d according to this embodiment can accurately output the output signals (oscillation signals) Q and QB having the desired frequency even when the delay time Td caused by the operation delay of the comparator and the RS flip-flop varies with fluctuations in temperature or power supply voltage.

Further, in the oscillation circuit 1d according to this embodiment, since the constant current source circuit, the switches, and the capacitors are shared to implement the respective functions of the electric-charge charge/discharge unit 12 and the control voltage generation unit 16, it is possible to reduce the circuit size and power consumption.

Furthermore, in the oscillation circuit 1d according to this embodiment, since the constant current source circuit, the switches, and the capacitors are shared to implement the respective functions of the electric-charge charge/discharge unit 12 and the control voltage generation unit 16, for example it is possible to eliminate the error between current values that can be caused by the constant current source circuits provided separately.

While this embodiment has been described by way of example in which the electric-charge charge/discharge unit 12 and the control voltage generation unit 16 in the oscillation circuit 1 shown in FIG. 1 are replaced with the one electric-charge charge/discharge and control voltage generation unit 18, the invention is not limited thereto. Similarly, the same effect can be obtained by replacing the electric-charge charge/discharge unit 12b and the control voltage generation unit 16 in the oscillation circuit 1b shown in FIG. 5 with the one electric-charge charge/discharge and control voltage generation unit 18.

Sixth Embodiment

Figure 9:
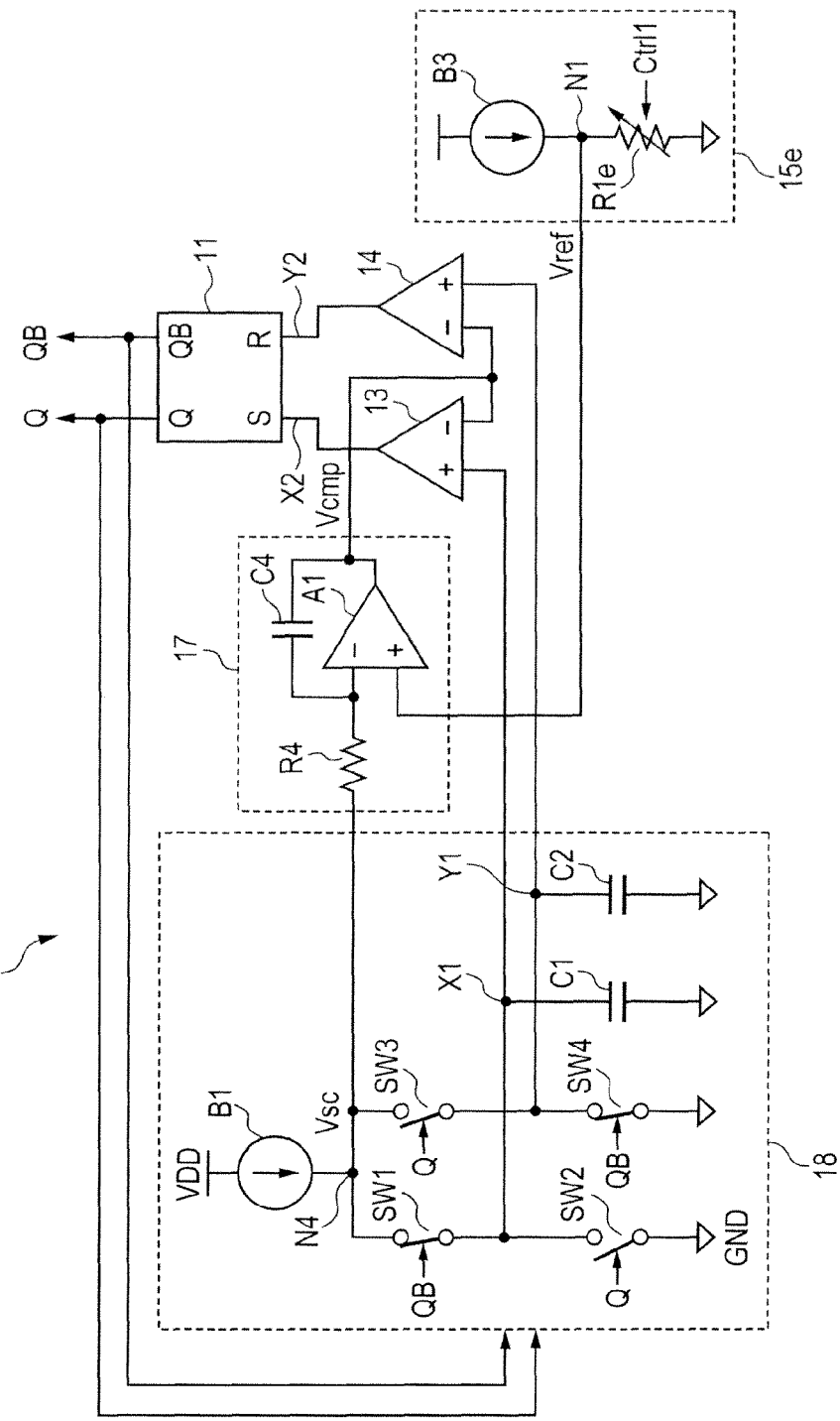
FIG. 9 is a block diagram showing the configuration of an oscillation circuit according to a sixth embodiment of the invention.

FIG. 9 is a block diagram showing the configuration of an oscillation circuit 1e according to a sixth embodiment of the invention. In comparison with the oscillation circuit 1d shown in FIG. 8, the oscillation circuit 1e shown in FIG. 9 includes a reference voltage generation unit 15e in place of the reference voltage generation unit 15.

The reference voltage generation unit 15e has the constant current source circuit B3 and a variable resistance element R1e. That is, in comparison with the reference voltage generation unit 15, the reference voltage generation unit 15e has the variable resistance element R1e in place of the resistance element R1. The variable resistance element R1e has a variable resistance value according to a control signal Ctrl1.

Thus, the reference voltage generation unit 15e can generate the reference voltage Vref having a desired voltage level by adjusting the resistance value of the variable resistance element R1e based on the control signal Ctrl1. Accordingly, the oscillation circuit 1e according to this embodiment can freely vary the oscillation frequency of the output signals (oscillation signals) Q and QB. Further, even if the current values of the constant current source circuits or the capacitance values of the capacitors have become different from intended values due to process variation, the oscillation circuit 1e according to this embodiment can adjust the oscillation frequency of the output signals (oscillation signals) Q and QB to the desired value by adjusting the resistance value of the variable resistance element R1e based on the control signal Ctrl1.

Figure 10:
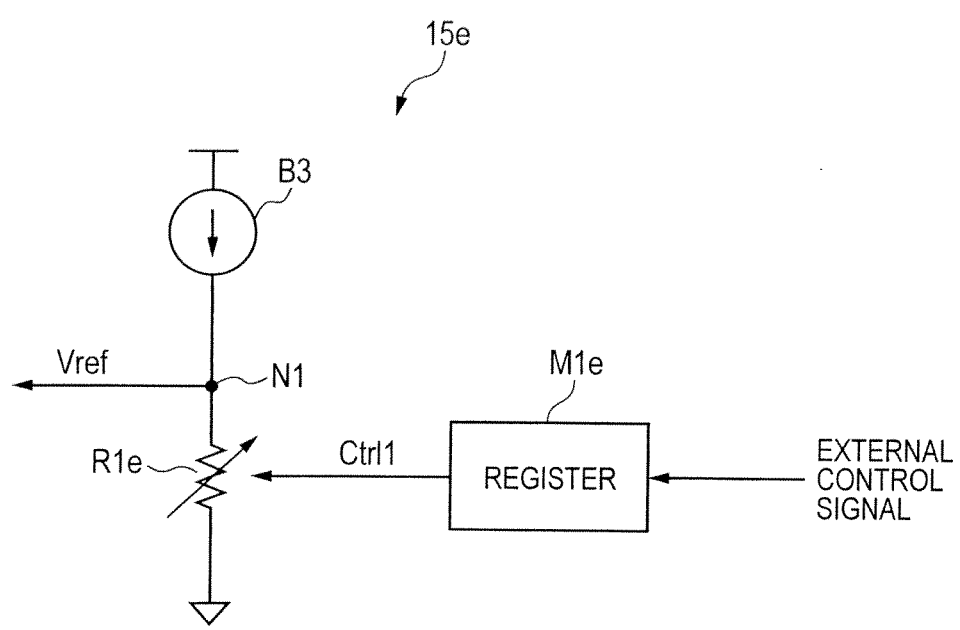
FIG. 10 is a diagram for explaining a control signal supplied to a reference voltage generation unit according to the sixth embodiment of the invention.

FIG. 10 is a diagram for explaining the control signal Ctrl1 supplied to the reference voltage generation unit 15e. As shown in FIG. 10, for example a register M1e is provided in the oscillation circuit 1e or a semiconductor integrated circuit including the oscillation circuit 1e. The register M1e stores information of a control signal (external control signal) supplied from outside, and outputs the control signal Ctrl1 based on the stored information. Thus, in the oscillation circuit 1e according to this embodiment, it is possible to externally control the control signal Ctrl1; therefore, it is possible to vary the oscillation frequency of the output signals (oscillation signals) Q and QB even after production. The register M1e may generate the control signal Ctrl1 according to a request from a CPU in place of the external control signal. Further, the register M1e may be a memory element such as flash memory.

Similarly, the same effect can be obtained by replacing the resistance element R1 of the reference voltage generation unit 15 in the oscillation circuits according to the above-described embodiments with the variable resistance element R1e.

Seventh Embodiment

Figure 11:
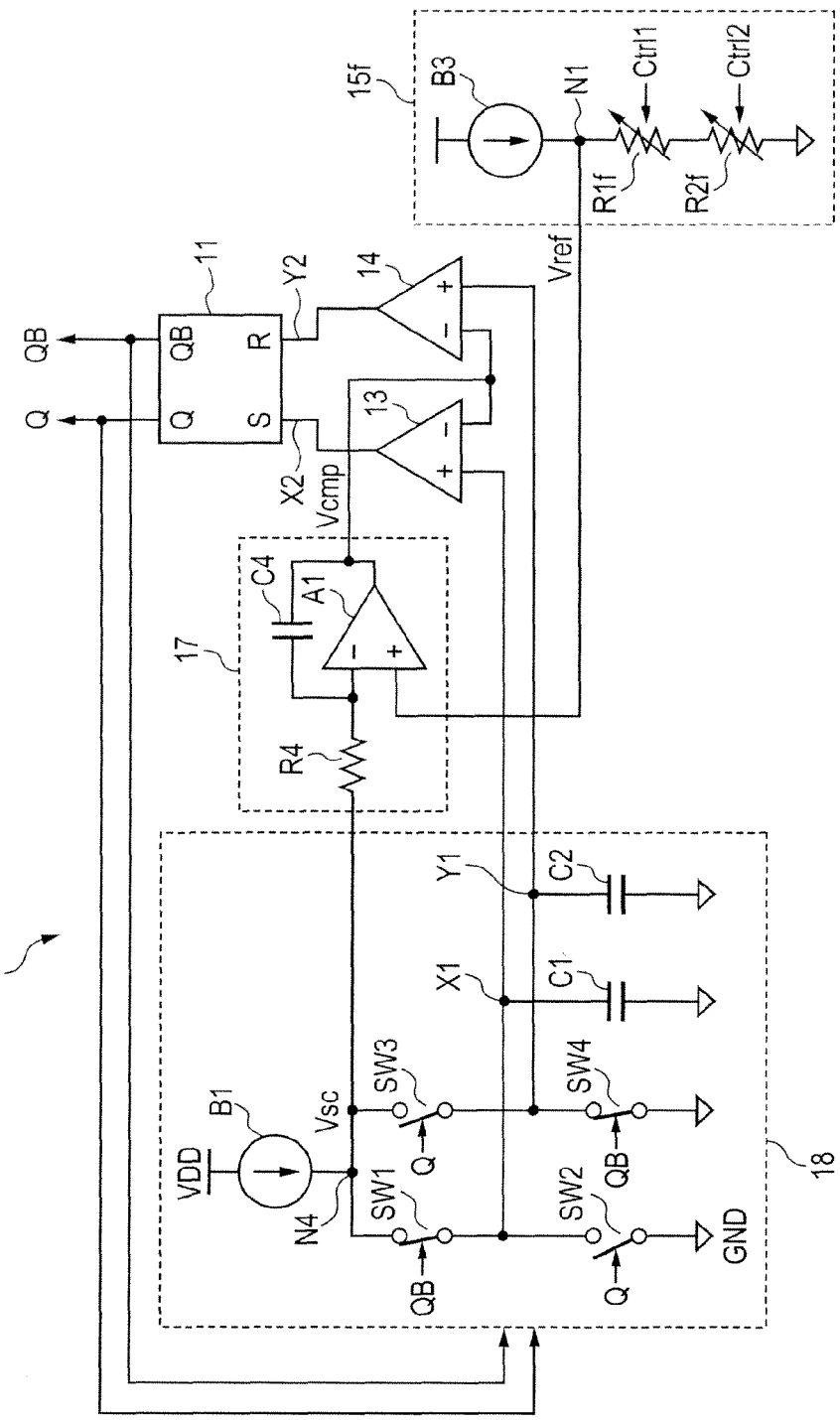
FIG. 11 is a block diagram showing the configuration of an oscillation circuit according to a seventh embodiment of the invention.

FIG. 11 is a block diagram showing the configuration of an oscillation circuit 1f according to a seventh embodiment of the invention. In comparison with the oscillation circuit 1d shown in FIG. 8, the oscillation circuit 1f shown in FIG. 11 includes a reference voltage generation unit 15f in place of the reference voltage generation unit 15.

The reference voltage generation unit 15f has the constant current source circuit B3, a variable resistance element (first resistance element) R1f, and a variable resistance element (second resistance element) R2f. That is, in comparison with the reference voltage generation unit 15, the reference voltage generation unit 15f has the variable resistance elements R1f and R2f in place of the resistance element R1. More specifically, the power supply voltage terminal VDD is coupled to the input terminal of the constant current source circuit B3. The output terminal of the constant current source circuit B3 is coupled through the node N1 to one terminal of the variable resistance element R1f. The other terminal of the variable resistance element R1f is coupled to one terminal of the variable resistance element R2f. The other terminal of the variable resistance element R2f is coupled to the ground voltage terminal GND. The reference voltage generation unit 15f outputs the voltage of the node N1 as the reference voltage Vref.

The variable resistance element R1f has a variable resistance value according to a control signal Ctrl1. Further, the variable resistance element R1f has a positive temperature dependence in which the resistance value increases with increasing temperature. The variable resistance element R2f has a variable resistance value according to a control signal Ctrl2. Further, the variable resistance element R2f has a negative temperature dependence in which the resistance value decreases with increasing temperature.

Thus, the reference voltage generation unit 15f can generate the reference voltage Vref having a desired voltage level by adjusting the resistance values of the variable resistance elements R1f and R2f based on the control signals Ctrl1 and Ctrl2 respectively. Accordingly, the oscillation circuit 1f according to this embodiment can freely vary the oscillation frequency of the output signals (oscillation signals) Q and QB. Further, even if the current values of the constant current source circuits or the capacitance values of the capacitors have become different from the intended value due to process variation, the oscillation circuit 1f according to this embodiment can adjust the oscillation frequency of the output signals (oscillation signals) Q and QB to the desired value by adjusting the resistance values of the variable resistance elements R1f and R2f based on the control signals Ctrl1 and Ctrl2 respectively.

Further, since the reference voltage generation unit 15f has the variable resistance elements R1f and R2f having the different temperature dependences, the reference voltage generation unit 15f can cancel resistance value change caused by temperature fluctuation. Therefore, the reference voltage generation unit 15f can generate the stable reference voltage Vref even with fluctuations in temperature.

Figure 12:
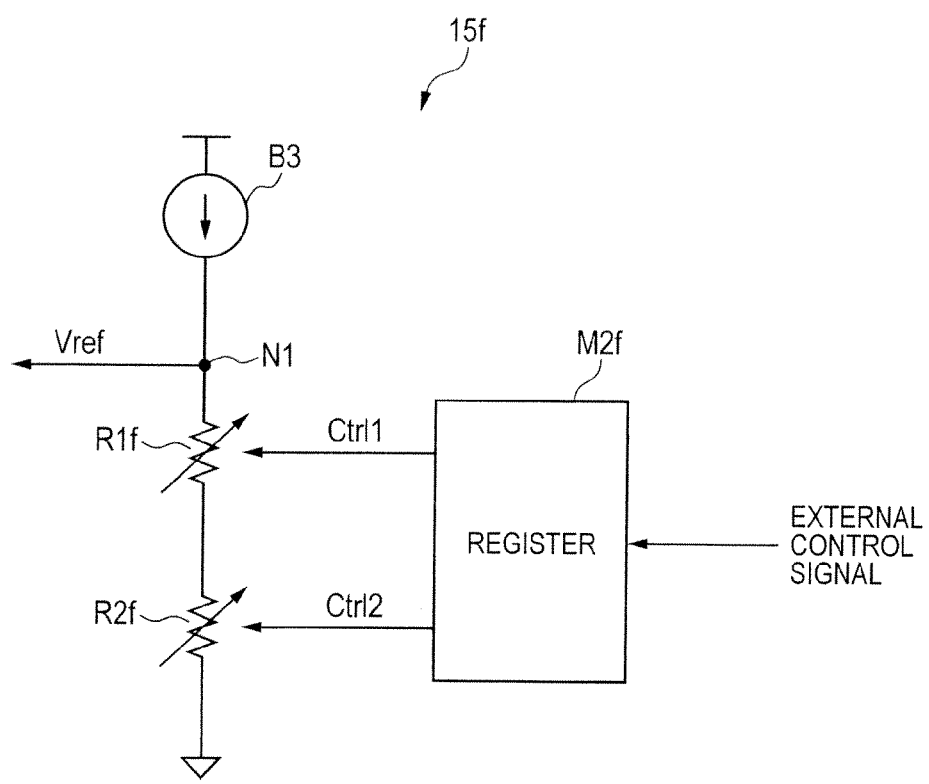
FIG. 12 is a diagram for explaining control signals supplied to a reference voltage generation unit according to the seventh embodiment of the invention.

FIG. 12 is a diagram for explaining the control signals Ctrl1 and Ctrl2 supplied to the reference voltage generation unit 15f. As shown in FIG. 12, for example a register M2f is provided in the oscillation circuit 1f or a semiconductor integrated circuit including the oscillation circuit 1f. The register M2f stores information of a control signal (external control signal) supplied from outside, and outputs the control signals Ctrl1 and Ctrl2 based on the stored information. Thus, in the oscillation circuit 1f according to this embodiment, it is possible to externally control the control signals Ctrl1 and Ctrl2; therefore, it is possible to vary the oscillation frequency of the output signals (oscillation signals) Q and QB even after production. The register M2f may generate the control signals Ctrl1 and Ctrl2 according to a request from the CPU in place of the external control signal. Further, the register M2f may be a memory element such as flash memory.

Similarly, the same effect can be obtained by replacing the resistance element R1 of the reference voltage generation unit 15 in the oscillation circuits according to the above-described embodiments with the variable resistance elements R1f and R2f.

Eighth Embodiment

Figure 13:
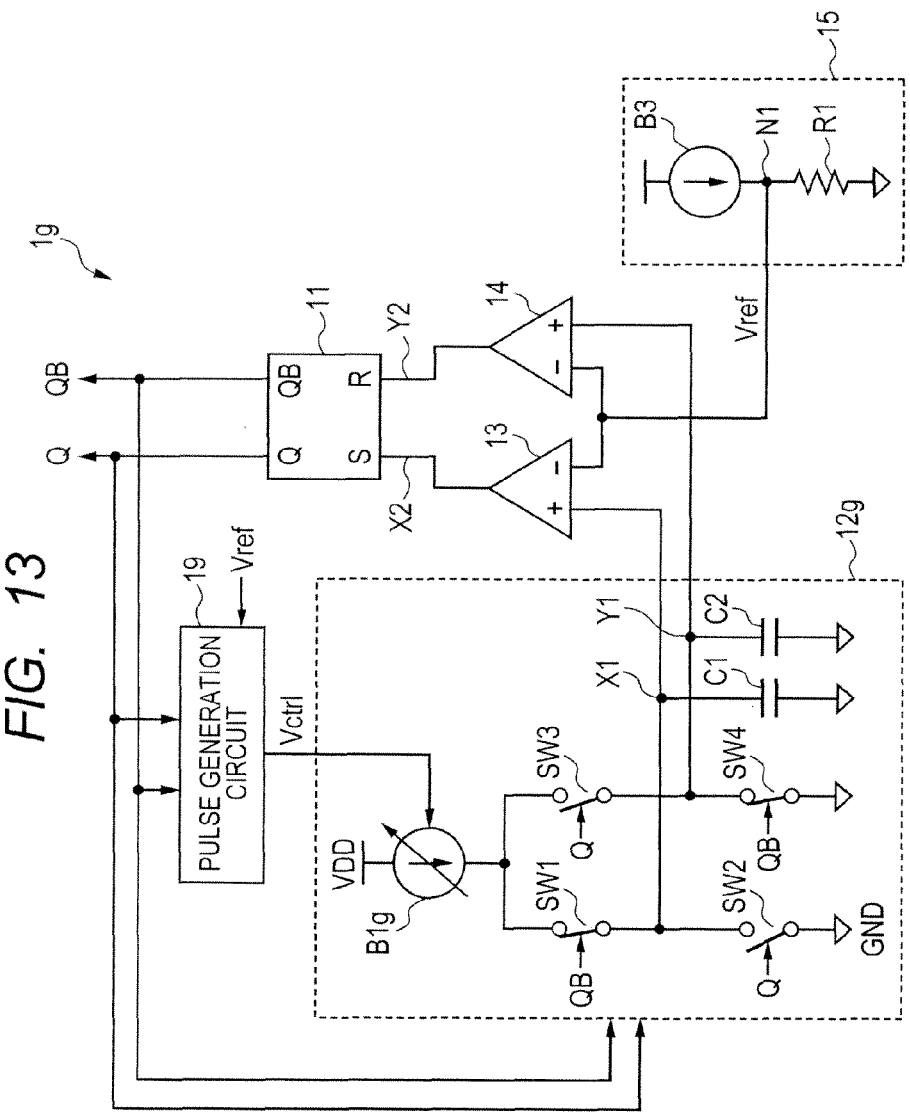
FIG. 13 is a block diagram showing the configuration of an oscillation circuit according to an eighth embodiment of the invention.

FIG. 13 is a block diagram showing the configuration of an oscillation circuit 1g according to an eighth embodiment of the invention. In comparison with the oscillation circuit 1b shown in FIG. 5, the oscillation circuit 1g shown in FIG. 13 includes an electric-charge charge/discharge unit 12g in place of the electric-charge charge/discharge unit 12b and a pulse generation circuit (control unit) 19 in place of the control voltage generation unit 16 and the comparison voltage generation unit 17.

The electric-charge charge/discharge unit 12g has a variable current source circuit B1g, the switches SW1 to SW4, and the capacitors C1 and C2. That is, the electric-charge charge/discharge unit 12b has a variable current source circuit B1g in place of the constant current source circuit B1. The variable current source circuit B1g feeds a current according to a control signal (current control signal) Vctrl outputted from the pulse generation circuit 19. For example, when the voltage level of the control signal Vctrl is at the L level (second logic value), a current having a current value I flows through the variable current source circuit B1g. On the other hand, when the voltage level of the control signal Vctrl is at the H level (first logic value), a current having a current value 2I (two times the current value I) flows through the variable current source circuit B1g. The rise rate (slew rate) of the voltage levels of the nodes X1 and Y1 when the current having the current value 2I flows through the variable current source circuit B1g is two times the rise rate (slew rate) of the voltage levels of the nodes X1 and Y1 when the current having the current value I flows through the variable current source circuit B1g.

The pulse generation circuit 19 generates the control signal Vctrl having substantially the same pulse width as the delay time Td in synchronization with the logic value changes of the output signals Q and QB. In other words, the pulse generation circuit 19 raises the control signal Vctrl in synchronization with the logic value changes of the output signals Q and QB, and lowers the control signal Vctrl after the lapse of the delay time Td. Since the period of the output signals Q and QB varies depending on the delay time Td, it can also be said that the pulse generation circuit 19 generates the control signal Vctrl having the pulse width according to the period of the output signals Q and QB.

Figure 14:
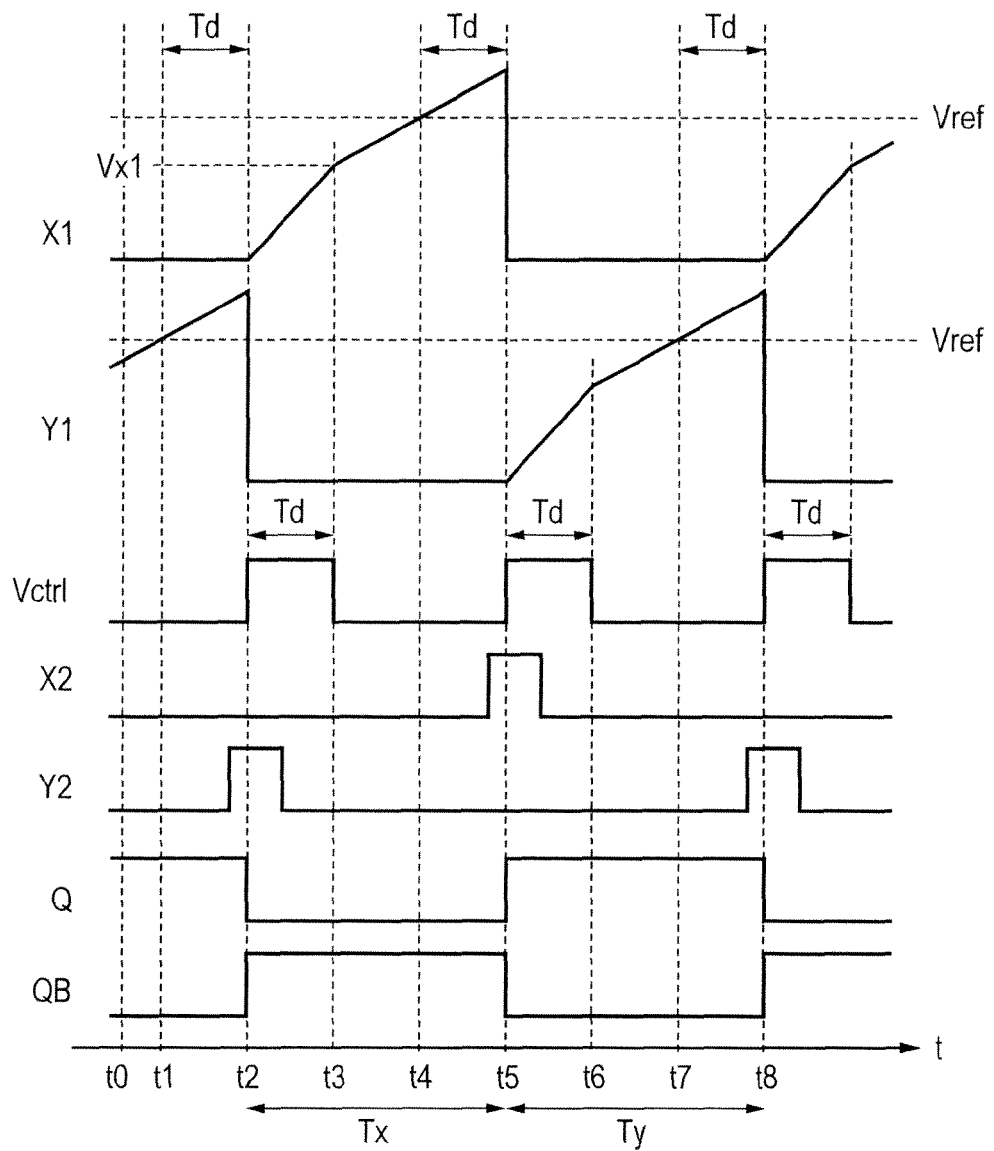
FIG. 14 is a timing chart showing the operation of the oscillation circuit according to the eighth embodiment of the invention.

FIG. 14 is a timing chart showing the operation of the oscillation circuit 1g shown in FIG. 13. In the example of FIG. 14, at time to, since the output signal Q is at the H level and the output signal QB is at the L level, the switches SW1 and SW4 are turned off and the switches SW2 and SW3 are turned on. Accordingly, the voltage level (second voltage) of the node Y1 gradually rises, whereas the voltage level (first voltage) of the node X1 is at the ground voltage level (L level). When the voltage level of the node Y1 reaches the reference voltage Vref (time t1), the comparator 14 raises the comparison result Y2 with a little delay. At this time, the comparator 13 outputs the comparison result X2 of the L level. Consequently, the RS flip-flop 11 lowers the output signal Q and raises the output signal QB (time t2). In other words, when the voltage level of the node Y1 reaches the reference voltage Vref (time t1), after the lapse of the delay time Td caused by the operation delay of the comparator 14 and the RS flip-flop 11, the output signal Q falls and the output signal QB rises (time t2).

Since the output signal Q is at the L level and the output signal QB is at the H level, the switches SW1 and SW4 are turned on and the switches SW2 and SW3 are turned off (time t2). Accordingly, the voltage level of the node X1 gradually rises, whereas the voltage level of the node Y1 is at the ground voltage level (L level). At this time, the pulse generation circuit 19 raises the control signal Vctrl in synchronization with the logic value changes of the output signals Q and QB (time t2). Then, the pulse generation circuit 19 lowers the control signal Vctrl after the lapse of the delay time Td (time t3). That is, the pulse generation circuit 19 outputs the control signal Vctrl having substantially the same pulse width as the delay time Td in synchronization with the logic value changes of the output signals Q and QB.

During the duration when the voltage level of the control signal Vctrl is at the H level (time t2 to time t3), the current having the current value 2I flows through the variable current source circuit B1g, so that the voltage level of the node X1 rises at twice the normal rate (slew rate). After the control signal Vctrl falls (time t3 to time t5), the current having the normal current value I flows through the variable current source circuit B1g, so that the voltage level of the node X1 rises at the normal rate (slew rate).

When the voltage level of the node X1 reaches the reference voltage Vref (time t4), the comparator 13 raises the comparison result X2 with a little delay. At this time, the comparator 14 outputs the comparison result Y2 of the L level. Consequently, the RS flip-flop 11 raises the output signal Q and lowers the output signal QB (time t5). In other words, when the voltage level of the node X1 reaches the reference voltage Vref (time t4), after the lapse of the delay time Td caused by the operation delay of the comparator 13 and the RS flip-flop 11, the output signal Q rises and the output signal QB falls (time t5).

The voltage level Vx1 of the node X1 at the time (t3) when the control signal Vctrl falls is expressed as follows.

$$Vx1 = 2I \cdot Td/C1 \qquad (6)$$

where C1 denotes the capacitance value of the capacitor C1.

The difference voltage between the reference voltage Vref and the voltage level Vx1 of the node X1 is expressed as follows.

$$Vref - Vx1 = Vref - 2I \cdot Td/C1 \qquad (7)$$

Therefore, the duration Tx from when the logic values of the output signals Q and QB change at time t2 to when the logic values change again at time t5 is expressed as follows.

$$Tx = Td + C1/I \cdot (Vref - 2I \cdot Td/C1) + Td \qquad (8)$$
$$= C1 \cdot Vref/I = RC1$$

As is obvious from equation (8), the duration Tx is determined independent of the delay time Td.

Then, since the output signal Q is at the H level and the output signal QB is at the L level, the switches SW1 and SW4 are turned off and the switches SW2 and SW3 are turned on (time t5). Accordingly, the voltage level of the node Y1 gradually rises, whereas the voltage level of the node X1 is at the ground voltage level (L level). At this time, the pulse generation circuit 19 raises the control signal Vctrl in synchronization with the logic value changes of the output signals Q and QB (time t5). Then, the pulse generation circuit 19 lowers the control signal Vctrl after the lapse of the delay time Td (time t6). That is, the pulse generation circuit 19 outputs the control signal Vctrl having substantially the same pulse width as the delay time Td in synchronization with the logic value changes of the output signals Q and QB.

During the duration when the voltage level of the control signal Vctrl is at the H level (time t5 to time t6), the current having the current value 2I flows through the variable current source circuit B1g, so that the voltage level of the node Y1 rises at twice the normal rate (slew rate). After the control signal Vctrl falls (time t6 to time t8), the current having the normal current value I flows through the variable current source circuit B1g, so that the voltage level of the node Y1 rises at the normal rate (slew rate).

When the voltage level of the node Y1 reaches the reference voltage Vref (time t7), the comparator 14 raises the comparison result Y2 with a little delay. At this time, the comparator 13 outputs the comparison result X2 of the L level. Consequently, the RS flip-flop 11 raises the output signal Q and lowers the output signal QB (time t8). In other words, when the voltage level of the node Y1 reaches the reference voltage Vref (time t7), after the lapse of the delay time Td caused by the operation delay of the comparator 14 and the RS flip-flop 11, the output signal Q falls and the output signal QB rises (time t8). These operations are repeated.

With reference to equation (6) to equation (8), the duration Ty from when the logic values of the output signals Q and QB change at time t5 to when the logic values change again at time t8 is expressed as follows.

$$Ty = Td \cdot C2/I \cdot (Vref - 2I \cdot Td/C2) + Td \qquad (9)$$
$$= C2 \cdot Vref/I = RC2$$

where C2 denotes the capacitance value of the capacitor C2.

As is obvious from equation (9), the duration Ty is determined independent of the delay time Td.

Thus, the timings of the logic value changes of the output signals Q and QB are determined independent of the delay time Td. That is, even when the delay time Td caused by the operation delay of the comparator and the RS flip-flop varies with fluctuations in temperature or power supply voltage, the oscillation circuit 1g according to this embodiment can accurately output the output signals (oscillation signals) Q and QB having the desired frequency without being influenced by fluctuations in the delay time Td.

Further, the oscillation circuit 1g according to this embodiment can operate without being influenced by fluctuations in the delay time Td from the initial stage (e.g., first cycle) of the oscillation, which can quickly stabilize the oscillation of the output signals Q and QB.

While this embodiment has been described by way of example in which the pulse width (duration of the H level in this example) of the control signal Vctrl is substantially the same as the delay time Td, the invention is not limited thereto. The pulse width of the control signal Vctrl can be modified as appropriate within the scope of small variations in the durations Tx and Ty according to fluctuations in the delay time Td. In this case, although the oscillation circuit according to the invention might operate under the influence of fluctuations in the delay time Td, the influence can be reduced.

Further, while this embodiment has been described by way of example in which twice the normal current flows through the variable current source circuit B1g while the control signal Vctrl is asserted (the voltage level of the control signal Vctrl is at the H level in this example), the invention is not limited thereto. The current value of the current flowing through the variable current source circuit B1g while the control signal Vctrl is asserted can be modified as appropriate within the scope of small variations in the durations Tx and Ty according to fluctuations in the delay time Td. In this case, although the oscillation circuit according to the invention might operate under the influence of fluctuations in the delay time Td, the influence can be reduced.

Ninth Embodiment

Figure 15:
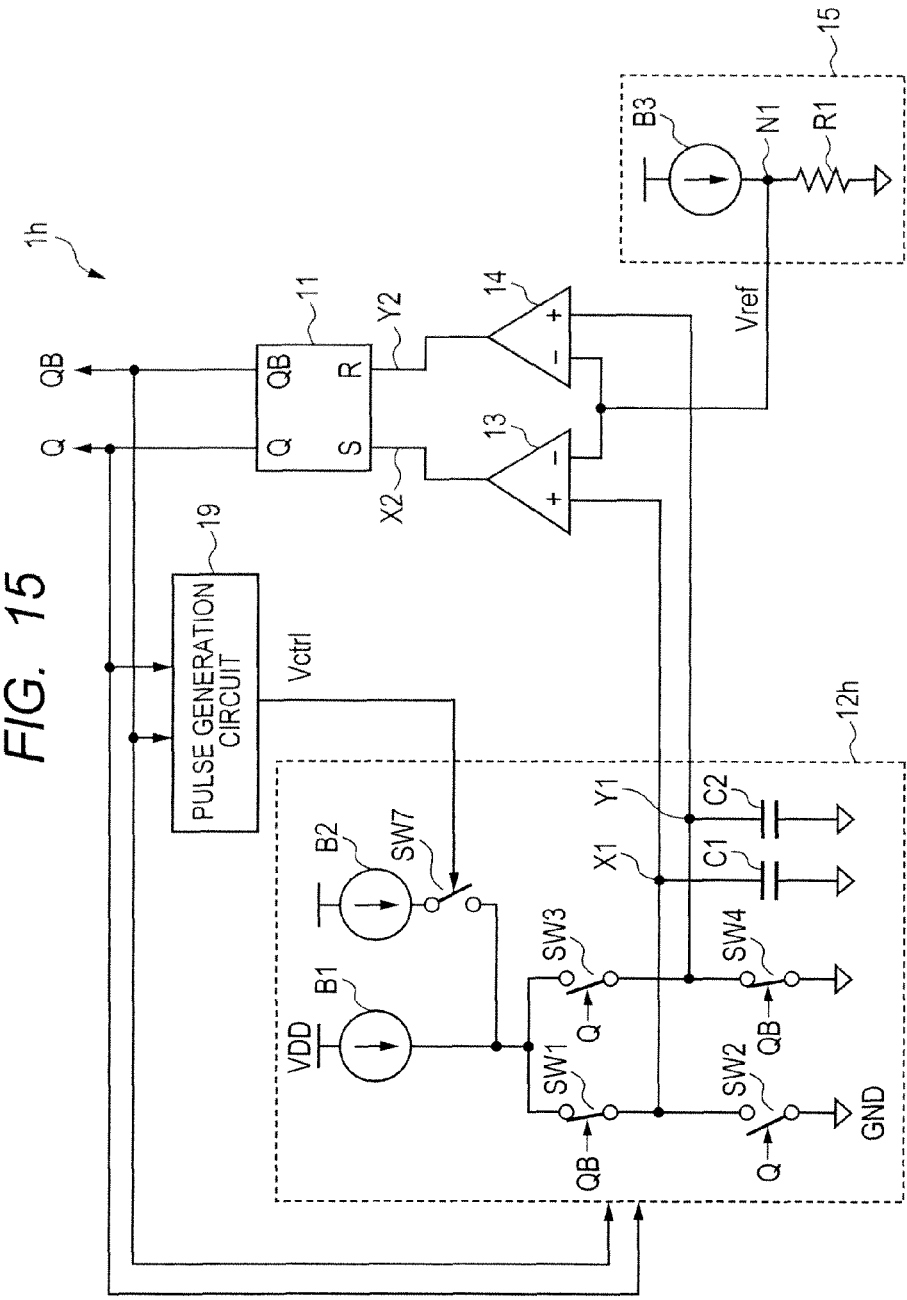
FIG. 15 is a block diagram showing the configuration of an oscillation circuit according to a ninth embodiment of the invention.

FIG. 15 is a block diagram showing the configuration of an oscillation circuit 1h according to a ninth embodiment of the invention. In comparison with the oscillation circuit 1g shown in FIG. 13, the oscillation circuit 1h shown in FIG. 15 includes an electric-charge charge/discharge unit 12h in place of the electric-charge charge/discharge unit 12g. The oscillation circuit 1h shown in FIG. 15 is a more specific configuration example of the oscillation circuit 1g shown in FIG. 13.

In comparison with the electric-charge charge/discharge unit 12g, the electric-charge charge/discharge unit 12h has constant current source circuits B1 and B2 and a switch SW7 in place of the variable current source circuit B1g. The input terminal of the constant current source circuit B1 is coupled to the power supply voltage terminal VDD, and the output terminal of the constant current source circuit B1 is coupled to one terminal of the switch SW1 and one terminal of the switch SW3. The input terminal of the constant current source circuit B2 is coupled to the power supply voltage terminal VDD, and the output terminal of the constant current source circuit B2 is coupled to one terminal of the switch SW7. The other terminal of the switch SW7 is coupled to the one terminal of the switch SW1 and the one terminal of the switch SW3. The current having the current value I flows through each of the constant current source circuits B1 and B2. The switch SW7 is turned on or off based on the control signal Vctrl from the pulse generation circuit 19. The remaining circuit configuration of the electric-charge charge/discharge unit 12h is the same as that of the electric-charge charge/discharge unit 12g, and will not be described again.

For example, when the voltage level of the control signal Vctrl is at the H level, the switch SW7 is turned on, so that the current having the current value 2I flows through the node X1 or Y1. On the other hand, when the voltage level of the control signal Vctrl is at the L level, the switch SW7 is turned off, so that the current having the current value I flows through the node X1 or Y1. The remaining circuit configuration and operation of the oscillation circuit 1h shown in FIG. 15 are the same as those of the oscillation circuit 1g shown in FIG. 13, and will not be described again.

With this circuit configuration, the oscillation circuit 1h shown in FIG. 15 can provide the same effect as the oscillation circuit 1g shown in FIG. 13. Further, the current value of the current flowing through the constant current source circuit B2 can be modified as appropriate within the scope of small variations in the durations Tx and Ty according to fluctuations in the delay time Td. In this case, although the oscillation circuit according to the invention might operate under the influence of fluctuations in the delay time Td, the influence can be reduced.

Tenth Embodiment

In this embodiment, a specific example of the pulse generation circuit 19 shown in FIGS. 13 and 15 will be described. Hereinafter, description will be made of the pulse generation circuit 19 which outputs the control signal Vctrl having substantially the same pulse width as the delay time Td in synchronization with the logic value changes of the output signals Q and QB.

Figure 16:
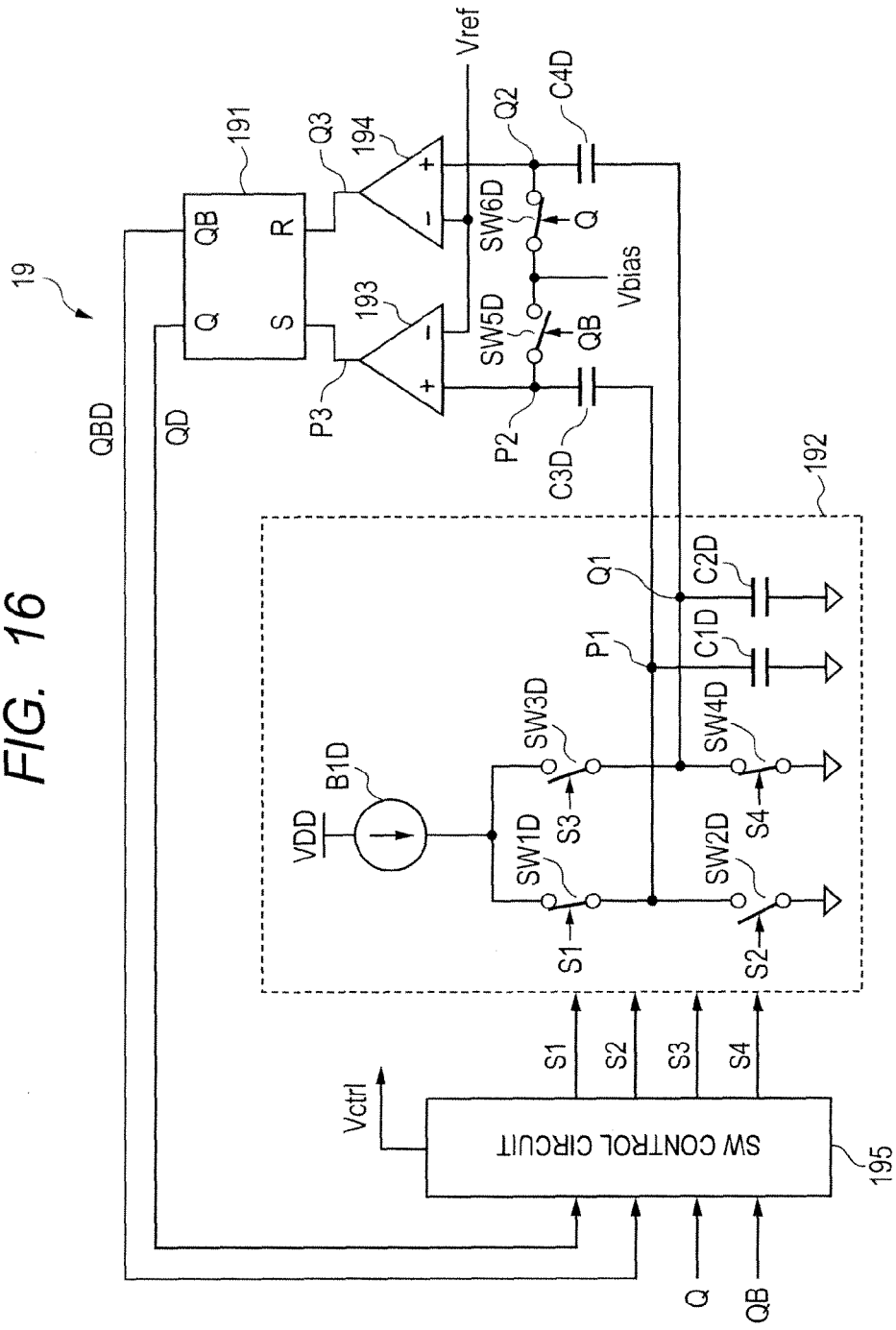
FIG. 16 is a block diagram showing the configuration of a pulse generation circuit according to a tenth embodiment of the invention.

FIG. 16 is a block diagram showing a specific configuration example of the pulse generation circuit 19. As shown in FIG. 16, the pulse generation circuit 19 has an RS flip-flop 191, an electric-charge charge/discharge unit 192, a comparator 193, a comparator 194, an SW control circuit 195, capacitors C3D and C4D, and switches SW5D and SW6D. The RS flip-flop 191 corresponds to the RS flip-flop 11 in the oscillation circuit 1g, the electric-charge charge/discharge unit 192 corresponds to the electric-charge charge/discharge unit 12g in the oscillation circuit 1g, and the comparators 193 and 194 respectively correspond to the comparators 13 and 14 in the oscillation circuit 1g.

The pulse generation circuit 19 is configured so that the RS flip-flop 191 outputs signals (oscillation signals) QD and QBD having substantially the same frequency as the output signals Q and QB. Further, the pulse generation circuit 19 is configured so that a delay time caused by the operation delay of the comparator 193, 194 and the RS flip-flop 191 is substantially the same as the delay time Td caused by the operation delay of the comparator 13, 14 and the RS flip-flop 11. Therefore, for example, the comparators 193 and 194 and the RS flip-flop 191 have the same configurations as the comparators 13 and 14 and the RS flip-flop 11, respectively.

The RS flip-flop 191 outputs the output signal QD from the output terminal Q, and outputs the output signal QBD (inversion signal of the output signal QD) from the output terminal QB, based on an input signal (comparison result P3 described below) supplied to the input terminal S and an input signal (comparison result Q3 described below) supplied to the input terminal R. The basic operation of the RS flip-flop 191 is the same as that of the RS flip-flop 11.

The SW control circuit 195 outputs switching signals S1 to S4 and the control signal Vctrl, based on the output signals QD and QBD of the RS flip-flop 191 and the output signals Q and QB of the RS flip-flop 11.

Figure 17:
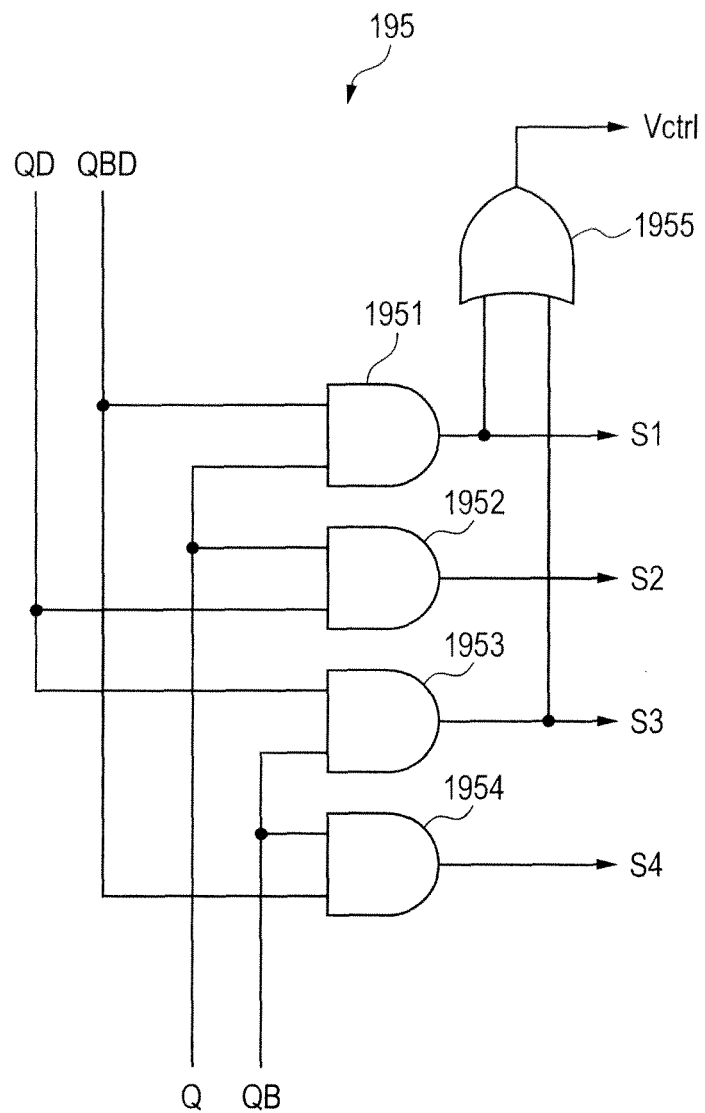
FIG. 17 is a block diagram showing a configuration example of an SW control circuit according to the tenth embodiment of the invention.

FIG. 17 is a block diagram showing a specific configuration example of the SW control circuit 195. As shown in FIG. 17, the SW control circuit 195 has AND circuits 1951 to 1954 and an OR circuit 1955. The AND circuit 1951 outputs the logical AND between the output signal QBD and the output signal Q as the switching signal S1. The AND circuit 1952 outputs the logical AND between the output signal QD and the output signal Q as the switching signal S2. The AND circuit 1953 outputs the logical AND between the output signal QD and the output signal QB as the switching signal S3. The AND circuit 1954 outputs the logical AND between the output signal QBD and the output signal QB as the switching signal S4. Then, the OR circuit 1955 outputs the logical OR between the switching signal S1 and the switching signal S3 as the control signal Vctrl.

Referring back to FIG. 16, the electric-charge charge/discharge unit 192 charges or discharges the capacitors C1D and C2D complementarily based on the switching signals S1 to S4 from the SW control circuit 195. The electric-charge charge/discharge unit 192 has a constant current source circuit B1D for feeding a constant current, switches SW1D to SW4D, and capacitors C1D and C2D.

The power supply voltage terminal VDD is coupled to the input terminal of the constant current source circuit B1D. The output terminal of the constant current source circuit BUD is coupled to one terminal of the switch SW1D and one terminal of the switch SW3D. The other terminal of the switch SW1D is coupled through a node P1 to one terminal of the switch SW2D. The other terminal of the switch SW2D is coupled to the ground voltage terminal GND. The other terminal of the switch SW3D is coupled through a node Q1 to one terminal of the switch SW4D. The other terminal of the switch SW4D is coupled to the ground voltage terminal GND.

The capacitor C1D is provided in parallel with the switch SW2D, between the node P1 and the ground voltage terminal GND. The capacitor C2D is provided in parallel with the switch SW4D, between the node Q1 and the ground voltage terminal GND.

The switches SW1D and SW4D are turned on or off based on the switching signals S1 to S4, respectively. The current having the current value I flows through the constant current source circuit B1D. The capacitors C1D and C2D have the same capacitance value as the capacitors C1 and C2. The basic operation of the electric-charge charge/discharge unit 192 is the same as that of the electric-charge charge/discharge unit 12g.

The capacitor C3D is provided between the node P1 and a node P2. The capacitor C4D is provided between the node Q1 and a node Q2. The switch SW5D and the switch SW6D are provided in series between the node P2 and the node Q2. The switch SW5D is turned on or off based on the output signal QB. The switch SW6D is turned on or off based on the output signal Q. A bias voltage Vbias is supplied to a node between the switch SW5D and the switch SW6D. For example, when the output signal Q is at the H level and the output signal QB is at the L level, the switch SW5D is turned off and the switch SW6D is turned on, so that the bias voltage Vbias is supplied to the node Q2 side. On the other hand, when the output signal Q is at the L level and the output signal QB is at the H level, the switch SW5D is turned on and the switch SW6D is turned off, so that the bias voltage Vbias is supplied to the node P2 side.

The example of FIG. 16 will be described by way of example in which the reference voltage Vref is used as the bias voltage Vbias. In this case, assume that the comparison result P3 is maintained at the L level when the voltage level of the node P1 is at the ground voltage level, and changes to the H level when the voltage level of the node P1 rises slightly. In the same way, assume that the comparison result Q3 is maintained at the L level when the voltage level of the node Q1 is at the ground voltage level, and changes to the H level when the voltage level of the node Q1 rises slightly. To implement such operations, in place of the reference voltage Vref, such a slightly lower voltage than the reference voltage Vref that the comparators 193 and 194 do not output the comparison result of the H level may be used as the bias voltage Vbias. The configuration of a reference voltage generation unit in this case will be described with reference to FIG. 19.

Figure 19:
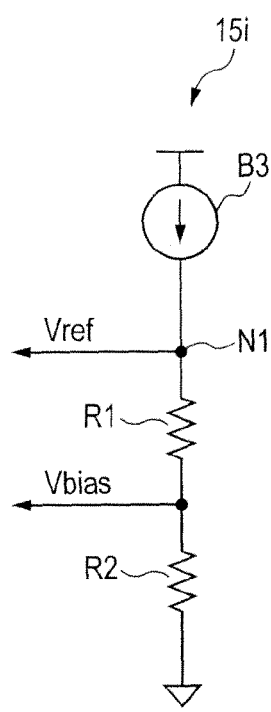
FIG. 19 is a diagram showing a modification of a reference voltage generation unit according to the tenth embodiment of the invention.

FIG. 19 is a diagram showing a reference voltage generation unit 15$i$ for generating the reference voltage Vref and the bias voltage Vbias having a voltage level slightly lower than the reference voltage Vref. As shown in FIG. 19, the reference voltage generation unit 15$i$ has a constant current source circuit B3 and resistance elements R1 and R2. The constant current source circuit B3 and the resistance elements R1 and R2 are provided in series between the power supply voltage terminal VDD and the ground voltage terminal GND. The reference voltage generation unit 15$i$ outputs the voltage of a node N1 between the constant current source circuit B3 and the resistance element R1 as the reference voltage Vref, and outputs the voltage of a node between the resistance element R1 and the resistance element R2 as the bias voltage Vbias.

Referring back to FIG. 16, the comparator 193 compares the reference voltage Vref and the voltage level of the node P2, and outputs the comparison result P3. In the example of FIG. 16, the comparator 193 outputs the comparison result P3 of the H level when the voltage level of the node P2 reaches the level of the reference voltage Vref, and outputs the comparison result P3 of the L level when the voltage level of the node P2 is less than the reference voltage Vref.

The comparator 194 compares the reference voltage Vref and the voltage level of the node Q2, and outputs the comparison result Q3. In the example of FIG. 16, the comparator 194 outputs the comparison result Q3 of the H level when the voltage level of the node Q2 reaches the level of the reference voltage Vref, and outputs the comparison result Q3 of the L level when the voltage level of the node Q2 is less than the reference voltage Vref.

Figure 18:
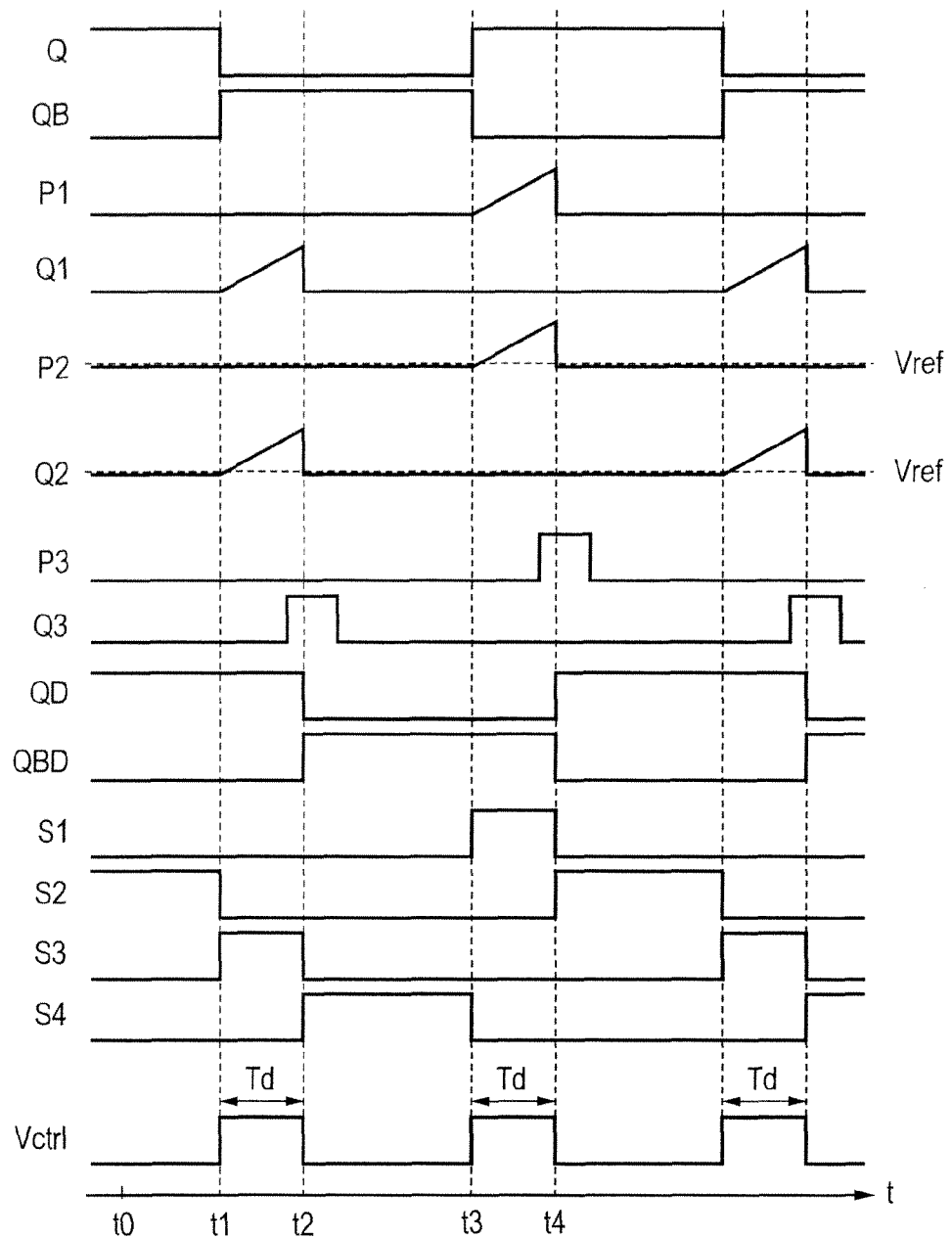
FIG. 18 is a timing chart showing the operation of the pulse generation circuit according to the tenth embodiment of the invention.

FIG. 18 is a timing chart showing the operation of the pulse generation circuit 19 shown in FIG. 16. In the example of FIG. 18, at time t0, the output signal Q is at the H level, the output signal QB is at the L level, the output signal QD is at the H level, and the output signal QBD is at the L level. Accordingly, the SW control circuit 195 outputs the switching signal S2 of the H level, the switching signals S1, S3, and S4 of the L level, and the control signal Vctrl of the L level. In this case, the switch SW1D is turned off and the switch SW2D is turned on, so that the voltage level of the node P1 falls to the L level. On the other hand, the switches SW3D and SW4D are turned off, so that the node Q1 becomes a floating state and maintains the L level. Further, the switch SW5D is turned off, so that the node P2 becomes a floating state and maintains the voltage level of the bias voltage Vbias (reference voltage Vref in this example). On the other hand, the switch SW6D is turned on, so that the node Q2 is pre-charged to the voltage level of the bias voltage Vbias. Accordingly, the comparators 193 and 194 output the comparison results P3 and Q3 of the L level.

When the output signal Q falls and the output signal QB rises, the SW control circuit 195 outputs the switching signal S3 of the H level, the switching signals S1, S2, and S4 of the L level, and the control signal Vctrl of the H level (time t1). Accordingly, the switch SW3D is turned on and the switch SW4D is turned off, so that the voltage level of the node Q1 gradually rises. On the other hand, the switches SW1D and SW2D are turned off, so that the node P1 becomes a floating state and maintains the L level. Further, the switch SW5D is turned on and the switch SW6D is turned off when the output signal Q falls and the output signal QB rises (time t1). Accordingly, the node P2 is pre-charged to the voltage level of the bias voltage Vbias. On the other hand, the node Q2 becomes a floating state and maintains the voltage level of the bias voltage Vbias.

The voltage level of the node Q2 rises as the voltage level of the node Q1 rises. More specifically, the node Q2 is at a voltage level obtained by adding a rise in the voltage level of the node Q1 to the bias voltage Vbias. When the voltage level of the node Q2 rises slightly higher than the bias voltage Vbias (around time t1), the comparator 194 raises the comparison result Q3 with a little delay. At this time, the comparator 193 outputs the comparison result P3 of the L level. Consequently, the RS flip-flop 191 lowers the output signal QD and raises the output signal QBD (time t2). In other words, when the voltage level of the node Q2 rises slightly higher than the bias voltage Vbias (around time t1), after the lapse of the delay time Td caused by the operation delay of the comparator 194 and the RS flip-flop 191, the output signal QD falls and the output signal QBD rises (time t2). Since the bias voltage Vbias is equal to or slightly lower than the reference voltage Vref, it can be considered that the voltage level of the node Q2 reaches such a voltage level as to be able to change the comparison result Q3 to the H level immediately after the logic value changes of the output signals Q and QB, that is, at time t1.

When the output signal QD falls and the output signal QBD rises, the SW control circuit 195 outputs the switching signal S4 of the H level, the switching signals S1 to S3 of the L level, and the control signal Vctrl of the L level (time t2). Accordingly, the switch SW3D is turned off and the switch SW4D is turned on, so that the voltage level of the node Q1 falls to the L level. Accordingly, the voltage level of the node Q2 falls to the level of the bias voltage Vbias. On the other hand, the switches SW1D and SW2D are turned off, so that the node P1 is in the floating state and maintains the L level. The voltage level of the node P2 also maintains the level of the bias voltage Vbias.

Thus, the pulse generation circuit 19 raises the control signal Vctrl in synchronization with the logic value changes of the output signals Q and QB (time t1), and lowers the control signal Vctrl after the lapse of the delay time Td (time t2). That is, the pulse generation circuit 19 outputs the control signal Vctrl having substantially the same pulse width as the delay time Td in synchronization with the logic value changes of the output signals Q and QB.

Then, when the output signal Q rises and the output signal QB falls, the SW control circuit 195 outputs the switching signal S1 of the H level, the switching signals S2 to S4 of the L level, and the control signal Vctrl of the H level (time t3). Accordingly, the switch SW1D is turned on and the switch SW2D is turned off, so that the voltage level of the node P1 gradually rises. On the other hand, the switches SW3D and SW4D are turned off, so that the node Q1 becomes the floating state and maintains the L level. Further, the switch SW5D is turned off and the switch SW6D is turned on when the output signal Q rises and the output signal QB falls (time t3). Accordingly, the node Q2 is pre-charged to the voltage level of the bias voltage Vbias. On the other hand, the node P2 becomes the floating state and maintains the voltage level of the bias voltage Vbias.

The voltage level of the node P2 rises as the voltage level of the node P1 rises. More specifically, the node P2 is at a voltage level obtained by adding a rise in the voltage level of the node P1 to the bias voltage Vbias. When the voltage level of the node P2 rises slightly higher than the bias voltage Vbias (around time t3), the comparator 193 raises the comparison result P3 with a little delay. At this time, the comparator 194 outputs the comparison result Q3 of the L level. Consequently, the RS flip-flop 191 raises the output signal QD and lowers the output signal QBD (time t4). In other words, when the voltage level of the node P2 rises slightly higher than the bias voltage Vbias (around time t3), after the lapse of the delay time Td caused by the operation delay of the comparator 193 and the RS flip-flop 191, the output signal QD rises and the output signal QBD falls (time t4). Since the bias voltage Vbias is equal to or slightly lower than the reference voltage Vref, it can be considered that the voltage level of the node P2 reaches such a voltage level as to be able to change the comparison result P3 to the H level immediately after the logic value changes of the output signals Q and QB, that is, at time t3.

When the output signal QD rises and the output signal QBD falls, the SW control circuit 195 outputs the switching signal S2 of the H level, the switching signals S1, S3, and S4 of the L level, and the control signal Vctrl of the L level (time t4). Accordingly, the switch SW1D is turned off and the switch SW2D is turned on, so that the voltage level of the node P1 falls to the L level. Accordingly, the voltage level of the node P2 falls to the level of the bias voltage Vbias. On the other hand, the switches SW3D and SW4D are turned off, so that the node Q1 is in the floating state and maintains the L level. The voltage level of the node Q2 also maintains the level of the bias voltage Vbias. These operations are repeated.

Thus, the pulse generation circuit 19 raises the control signal Vctrl in synchronization with the logic value changes of the output signals Q and QB (time t3), and lowers the control signal Vctrl after the lapse of the delay time Td (time t4). That is, the pulse generation circuit 19 outputs the control signal Vctrl having substantially the same pulse width as the delay time Td in synchronization with the logic value changes of the output signals Q and QB.

Eleventh Embodiment

Figure 20:
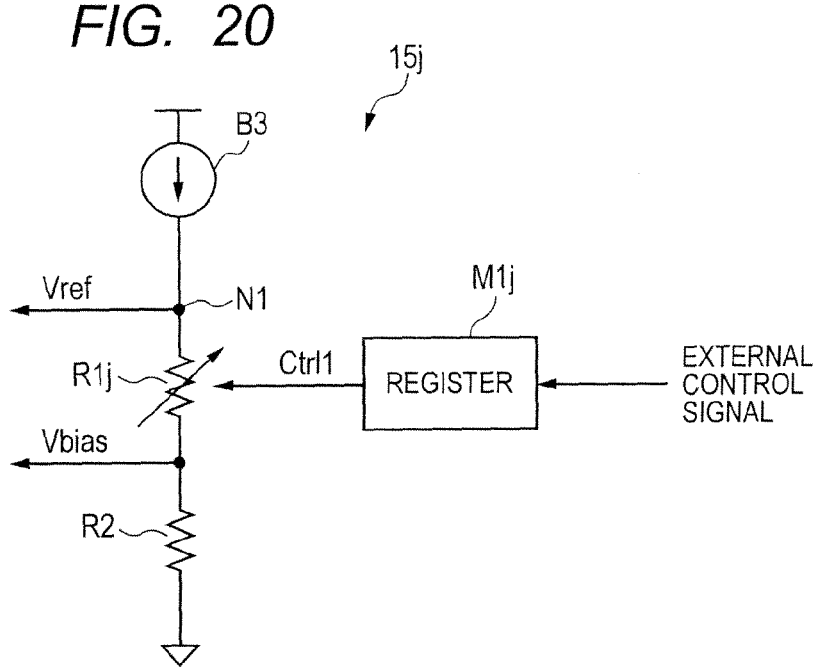
FIG. 20 is a block diagram showing the configuration of a reference voltage generation unit according to an eleventh embodiment of the invention.

FIG. 20 is a diagram showing a reference voltage generation unit 15$j$ according to an eleventh embodiment of the invention. The reference voltage generation unit 15$j$ shown in FIG. 20 is a modification of the reference voltage generation unit 15$i$ shown in FIG. 19, and generates the reference voltage Vref and the bias voltage Vbias having a voltage level slightly lower than the reference voltage Vref.

In comparison with the reference voltage generation unit 15$i$, the reference voltage generation unit 15$j$ has a variable resistance element R1$j$ in place of the resistance element R1.

The variable resistance element R1j has a variable resistance value according to a control signal Ctrl1.

The reference voltage generation unit 15j can generate the reference voltage Vref having a desired voltage level by adjusting the resistance value of the variable resistance element R1j based on the control signal Ctrl1. By including the reference voltage generation unit 15j, the oscillation circuit having the pulse generation circuit 19 shown in FIGS. 13 and 15 can freely vary the oscillation frequency of the output signals (oscillation signals) Q and QB.

Further, the reference voltage generation unit 15j can freely vary the difference between the reference voltage Vref and the bias voltage Vbias by adjusting the resistance value of the variable resistance element R1j based on the control signal Ctrl1. By including the reference voltage generation unit 15j, the oscillation circuit having the pulse generation circuit 19 shown in FIGS. 13 and 15 can adjust the timing of the logic value change of the control signal Vctrl outputted from the pulse generation circuit 19.

The control signal Ctrl1 is outputted from e.g. a register M1j provided in the oscillation circuit or a semiconductor integrated circuit including the oscillation circuit. The register M1j stores information of a control signal (external control signal) supplied from outside, and outputs the control signal Ctrl1 based on the stored information. Thus, in the oscillation circuit according to the invention, it is possible to externally control the control signal Ctrl1; therefore, it is possible to vary the oscillation frequency of the output signals (oscillation signals) Q and QB even after production. The register M1j may generate the control signal Ctrl1 according to a request from a CPU in place of the external control signal. Further, the register M1j may be a memory element such as flash memory.

Twelfth Embodiment

Figure 21:
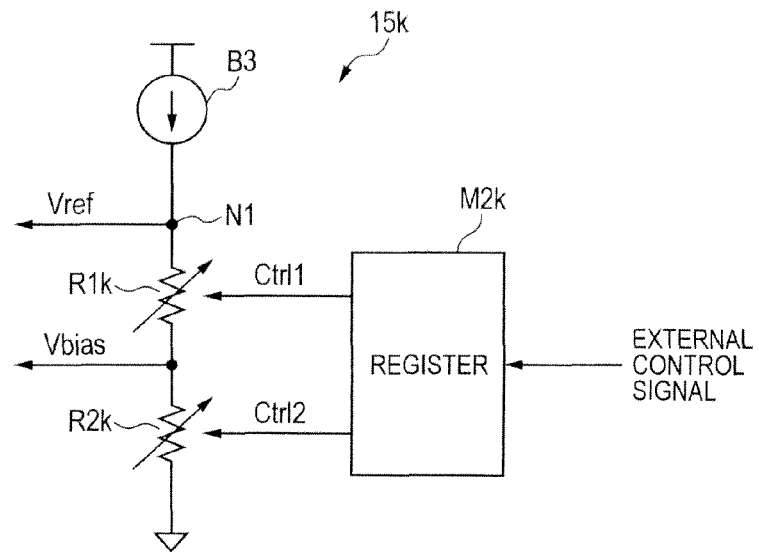
FIG. 21 is a block diagram showing the configuration of a reference voltage generation unit according to a twelfth embodiment of the invention.

FIG. 21 is a diagram showing a reference voltage generation unit 15k according to a twelfth embodiment of the invention. The reference voltage generation unit 15k shown in FIG. 21 is a modification of the reference voltage generation unit 15i shown in FIG. 19, and generates the reference voltage Vref and the bias voltage Vbias having a voltage level slightly lower than the reference voltage Vref.

In comparison with the reference voltage generation unit 15i, the reference voltage generation unit 15k has a variable resistance element R1k in place of the resistance element R1 and has a variable resistance element R2k in place of the resistance element R2. The variable resistance elements R1k and R2k have variable resistance values according to control signals Ctrl1 and Ctrl2 respectively. The control signals Ctrl1 and Ctrl2 are outputted from e.g. a register M2k provided in the oscillation circuit or a semiconductor integrated circuit including the oscillation circuit.

Thereby, the reference voltage generation unit 15k can provide the same effect as the reference voltage generation unit 15j shown in FIG. 20. Further, the reference voltage generation unit 15k can generate the bias voltage Vbias having a desired voltage level by adjusting the resistance value of the variable resistance element R2k based on the control signal Ctrl2.

Thirteenth Embodiment

Figure 22:
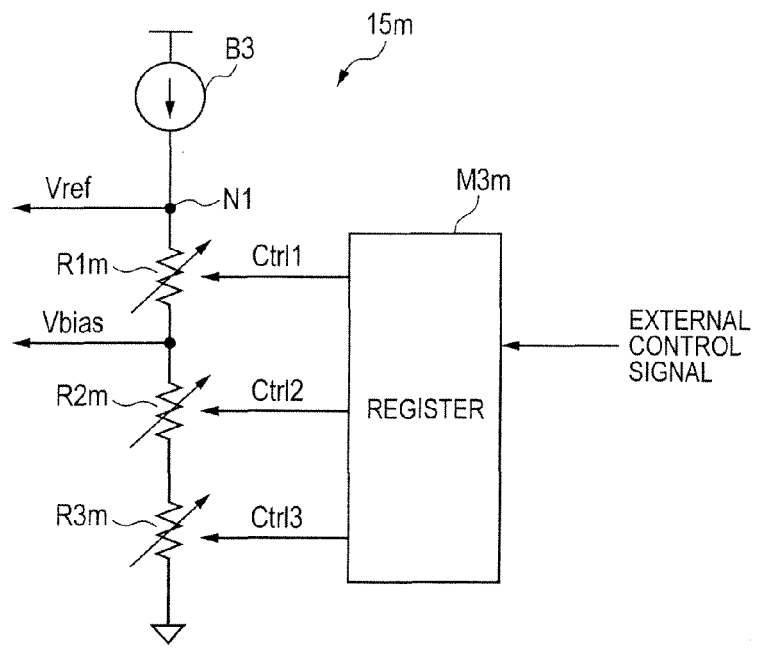
FIG. 22 is a block diagram showing the configuration of a reference voltage generation unit according to a thirteenth embodiment of the invention.

FIG. 22 is a diagram showing a reference voltage generation unit 15m according to a thirteenth embodiment of the invention. The reference voltage generation unit 15m shown in FIG. 22 is a modification of the reference voltage generation unit 15i shown in FIG. 19, and generates the reference voltage Vref and the bias voltage Vbias having a voltage level slightly lower than the reference voltage Vref.

In comparison with the reference voltage generation unit 15i, the reference voltage generation unit 15m has a variable resistance element R1m in place of the resistance element R1 and has variable resistance elements R2m and R3m in place of the resistance element R2. The variable resistance elements R1m, R2m, and R3m have variable resistance values according to control signals Ctrl1, Ctrl2, and Ctrl3 respectively. The control signals Ctrl1 to Ctrl3 are outputted from e.g. a register M3m provided in the oscillation circuit or a semiconductor integrated circuit including the oscillation circuit. The variable resistance element R2m has a positive temperature dependence in which the resistance value increases with increasing temperature. The variable resistance element R3m has a negative temperature dependence in which the resistance value decreases with increasing temperature.

Thereby, the reference voltage generation unit 15m can provide the same effect as the reference voltage generation unit 15k shown in FIG. 21. Further, since the reference voltage generation unit 15m has the variable resistance elements R2m and R3m having the different temperature dependences, the reference voltage generation unit 15m can cancel resistance value change caused by temperature fluctuation. Therefore, the reference voltage generation unit 15m can generate the stable reference voltage Vref even with fluctuations in temperature.

Fourteenth Embodiment

Figure 23:
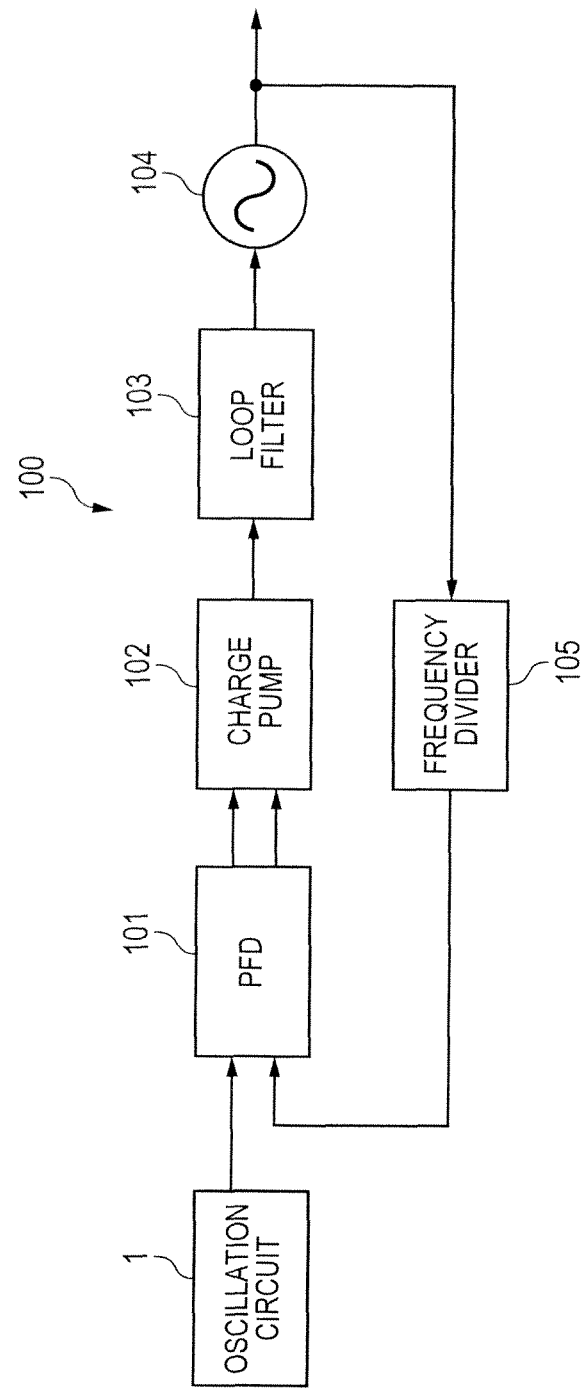
FIG. 23 is a block diagram showing the configuration of a PLL according to a fourteenth embodiment of the invention.

FIG. 23 is a block diagram showing a PLL to which the oscillation circuit according to the invention is applied. While this embodiment will be described by way of example in which the oscillation circuit 1 shown in FIG. 1 is applied to the PLL, the oscillation circuit according to another embodiment may be applied.

The PLL 100 shown in FIG. 23 includes the oscillation circuit 1, a phase comparator (PFD) 101, a charge pump 102, a loop filter 103, a voltage-controlled oscillator (VCO) 104, and a frequency divider 105. The phase comparator 101 and the charge pump 102 are collectively referred to as a phase difference detection unit.

The oscillation circuit 1 outputs an oscillation signal as a reference clock signal. The phase comparator 101 detects a phase difference between the reference clock signal from the oscillation circuit 1 and a frequency-divided clock signal from the frequency divider 105. The charge pump 102 generates an output voltage according to the phase difference detected by the phase comparator 101. The loop filter 103 converts the output voltage of the charge pump 102 into a DC signal, and outputs it as a control voltage. The voltage-controlled oscillator 104 outputs a clock signal having a frequency according to the control voltage. The frequency divider 105 frequency-divides the clock signal from the voltage-controlled oscillator 104, and outputs the frequency-divided clock signal.

Thus, the PLL to which the oscillation circuit according to the invention is applied multiplies the reference clock signal (oscillation signal) outputted from the oscillation circuit, and thereby can generate a faster clock signal with accuracy.

Fifteenth Embodiment

Figure 24:
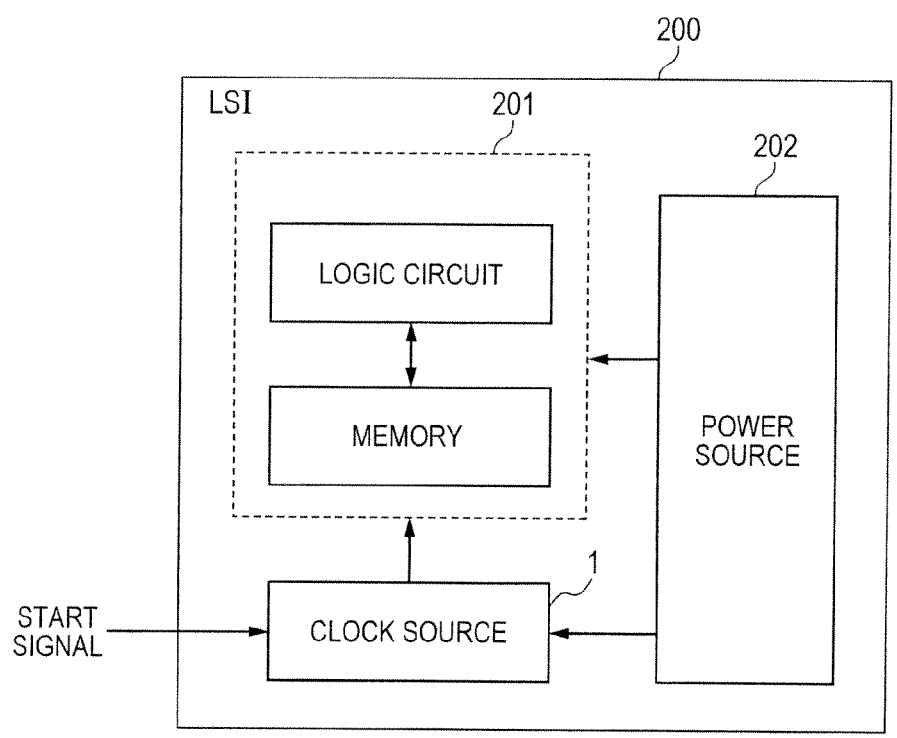
FIG. 24 is a block diagram showing the configuration of a semiconductor integrated circuit according to a fifteenth embodiment of the invention.

FIG. 24 is a block diagram showing a semiconductor integrated circuit (LSI) to which the oscillation circuit according to the invention is applied. While this embodiment will be described by way of example in which the oscillation circuit 1 shown in FIG. 1 as a clock source 1 is applied to the semiconductor integrated circuit, the oscillation circuit according to another embodiment may be applied.

The semiconductor integrated circuit 200 shown in FIG. 24 includes the clock source 1, an internal circuit 201 comprised of a logic circuit and a memory, and a power source 202. The power source 202 supplies a power supply voltage to the clock source 1 and the internal circuit 201. When a start signal from outside is asserted, the clock source 1 operates and outputs a clock signal (oscillation signal) having a preset frequency. The internal circuit 201 operates in synchronization with the clock signal supplied from the clock source 1.

Thus, the semiconductor integrated circuit 200 to which the oscillation circuit according to the invention is applied operates in synchronization with the accurate clock signal outputted from the oscillation circuit (clock source), and therefore can implement a stable operation. Particularly in the case where the oscillation circuit having the pulse generation circuit 19 shown in FIGS. 13 and 15 is applied to the semiconductor integrated circuit 200, the semiconductor integrated circuit 200 can quickly stabilize the clock signal, and thus can reduce the starting time.

Sixteenth Embodiment

Figure 25:
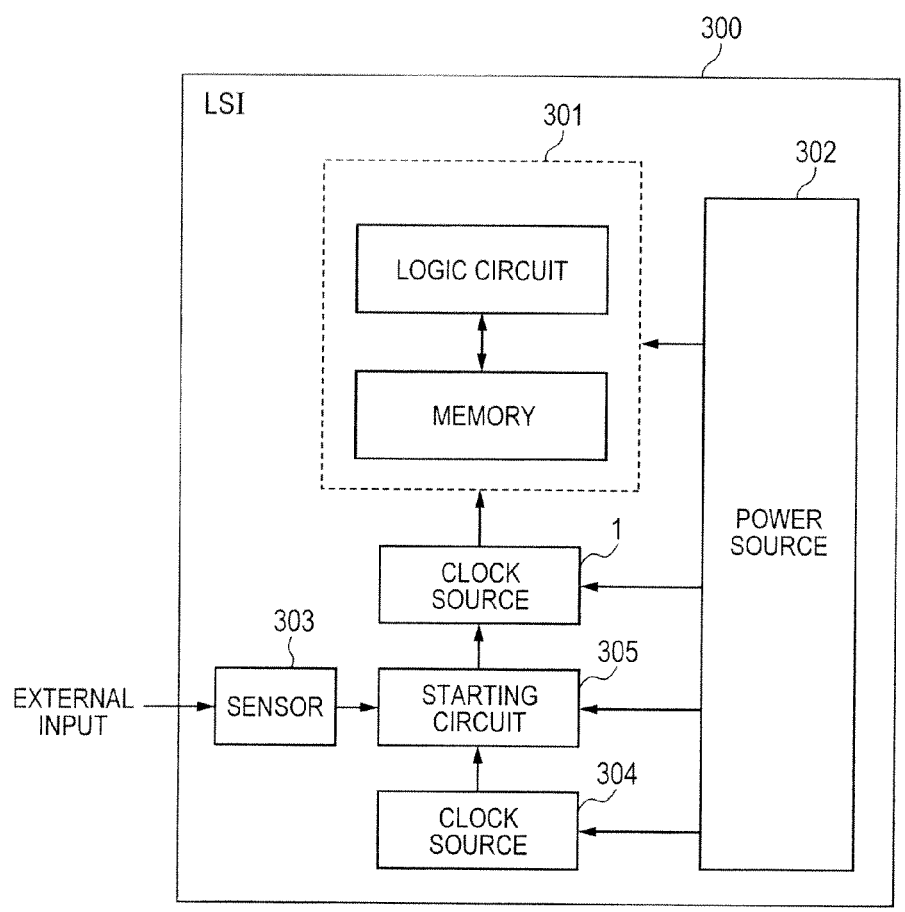
FIG. 25 is a block diagram showing the configuration of a semiconductor integrated circuit according to a sixteenth embodiment of the invention.

FIG. 25 is a block diagram showing a semiconductor integrated circuit (LSI) to which the oscillation circuit according to the invention is applied. While this embodiment will be described by way of example in which the oscillation circuit 1 shown in FIG. 1 as a clock source 1 is applied to the semiconductor integrated circuit, the oscillation circuit according to another embodiment may be applied.

The semiconductor integrated circuit 300 shown in FIG. 25 includes the clock source 1, an internal circuit 301 comprised of a logic circuit and a memory, a power source 302, a sensor 303, a clock source 304, and a starting circuit 305. The sensor 303, the clock source 304, and the starting circuit 305 are collectively referred to as a mode switching unit.

The power source 302 supplies a power supply voltage to the clock source 1, the clock source 304, the internal circuit 301, and the starting circuit 305. The clock source 304 outputs a low-speed clock signal of which high accuracy is not required. The sensor 303 controls the assertion state of an enable signal based on a signal supplied from outside. For example, when the sensor 303 is requested to operate the semiconductor integrated circuit 300 by the signal supplied from outside, the sensor 303 asserts the enable signal (e.g., raises the enable signal). In synchronization with the clock signal from the clock source 304, the starting circuit 305 captures the enable signal from the sensor 303 and outputs it as a start signal. When the start signal is asserted, the clock source 1 operates and outputs a clock signal (oscillation signal) having a preset frequency. Then, the internal circuit 301 operates in synchronization with the clock signal supplied from the clock source 1.

That is, the semiconductor integrated circuit 300 operates the internal circuit 301 by supplying the clock signal to the internal circuit 301 in a normal operation mode, and stops the operation of the internal circuit 301 by stopping the supply of the clock signal to the internal circuit 301 in a stop mode. Since the semiconductor integrated circuit 300 can stop the supply of the clock signal to the internal circuit 301 in the stop mode, it is possible to reduce the power consumption.

Thus, the semiconductor integrated circuit 300 to which the oscillation circuit according to the invention is applied operates in synchronization with the accurate clock signal outputted from the oscillation circuit (clock source), and therefore can implement a stable operation. Particularly in the case where the oscillation circuit having the pulse generation circuit 19 shown in FIGS. 13 and 15 is applied to the semiconductor integrated circuit 300, the semiconductor integrated circuit 200 can quickly stabilize the clock signal, and thus can reduce the starting time of each switching from the stop mode to the normal operation mode to achieve more effective operation.

Layout Configuration Example of Oscillation Circuit According to the Invention

Figure 26:
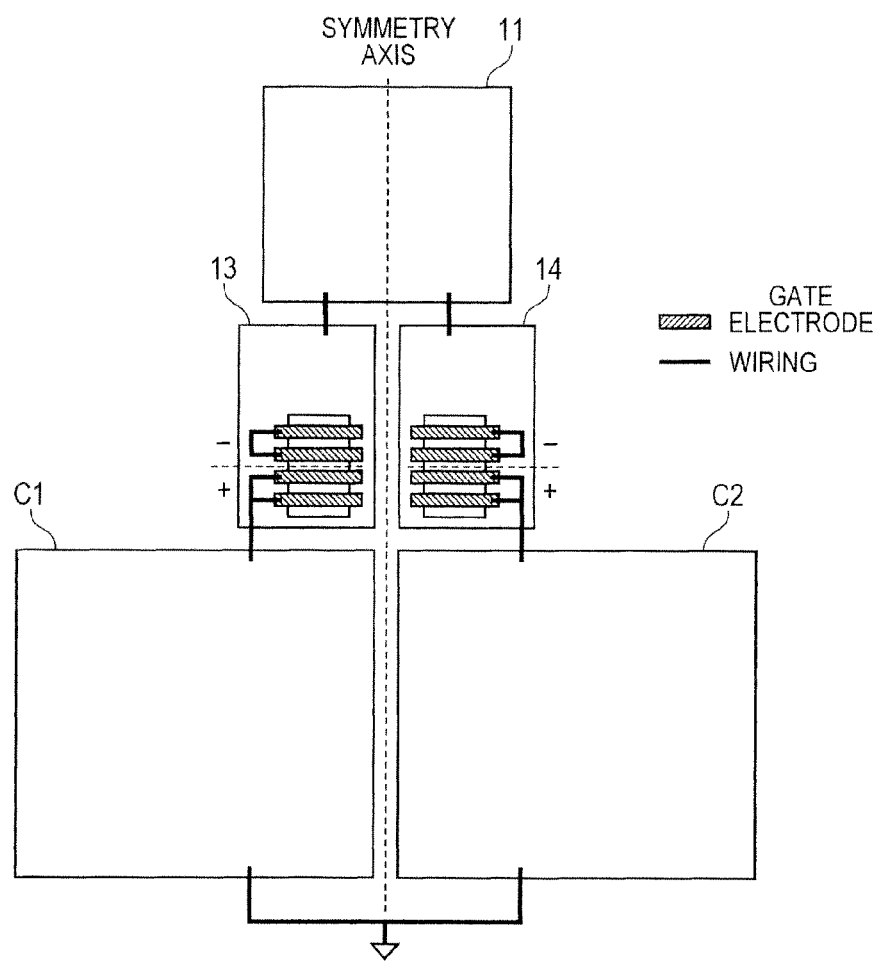
FIG. 26 is a diagram showing a layout configuration of the oscillation circuit according to the invention.

Hereinafter, the layout configuration of the oscillation circuit according to the invention will be described. FIG. 26 is a diagram showing an example of the layout configuration of the oscillation circuit according to the invention. In FIG. 26, an example of the layout configuration of the oscillation circuit 1 in FIG. 1 is representatively shown.

As shown in FIG. 26, the RS flip-flop 11, the pair of comparators 13 and 14 disposed side-by-side in the horizontal direction of the figure, and the pair of capacitors C1 and C2 disposed side-by-side in the horizontal direction of the figure are closely disposed in sequence from the top to the bottom of the figure. Further, the RS flip-flop 11, the comparators 13 and 14, and the capacitors C1 and C2 are disposed symmetrically with the vertical direction of the figure as a symmetry axis. Thus, a circuit for generating one (output signal Q) of the pair of differential signals and a circuit for generating the other (output signal QB) of the pair of differential signals are disposed symmetrically, which reduces the variation in accuracy between the differential signals.

Further, on the comparator 13, four gate electrodes are equally spaced in sequence from the middle to the bottom of the comparator 13. The longitudinal direction of the gate electrodes is the horizontal direction of the figure. In the example of FIG. 26, the top two of the four gate electrodes are used as the inverting input terminal of the comparator 13, and the bottom two electrodes are used as the non-inverting input terminal of the comparator 13. The two gate electrodes for the inverting input terminal of the comparator 13 and the two gate electrodes for the non-inverting input terminal are disposed symmetrically with the horizontal direction of the figure as a symmetry axis. The layout configuration of four gate electrodes on the comparator 14 is the same as that of the comparator 13, and will not be described again.

This layout configuration can reduce the length of wiring for coupling the comparator 13 and the capacitor C1 and the length of wiring for coupling the comparator 14 and the capacitor C2, which suppresses malfunctions due to the influence of wiring capacitance.

Figure 27:
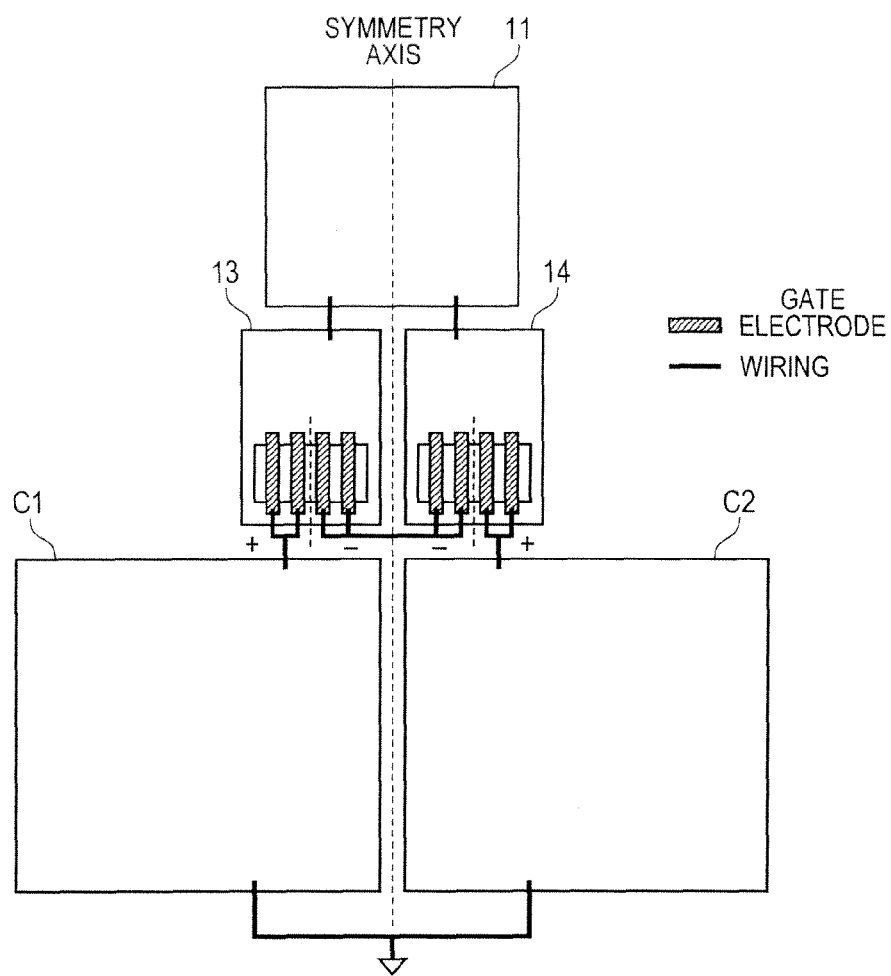
FIG. 27 is a diagram showing a layout configuration of the oscillation circuit according to the invention.

FIG. 27 is a diagram showing an example of the layout configuration of the oscillation circuit according to the invention. In FIG. 27, an example of the layout configuration of the oscillation circuit 1 in FIG. 1 is representatively shown. Hereinafter, only different portions from the layout configuration of FIG. 26 will be described.

As shown in FIG. 27, on the comparator 13, four gate electrodes are equally spaced in sequence from right to left in the lower part of the comparator 13. The longitudinal direction of the gate electrodes is the vertical direction of the figure. In the example of FIG. 27, the right two of the four gate electrodes are used as the inverting input terminal of the comparator 13, and the left two electrodes are used as the non-inverting input terminal of the comparator 13. The two gate electrodes for the inverting input terminal of the comparator 13 and the two gate electrodes for the non-inverting input terminal are disposed symmetrically with the vertical direction of the figure as a symmetry axis. The layout configuration of four gate electrodes on the comparator 14 is the same as that of the comparator 13, and will not be described again.

This layout configuration can provide the same effect as the layout configuration shown in FIG. 26.

Figure 28:
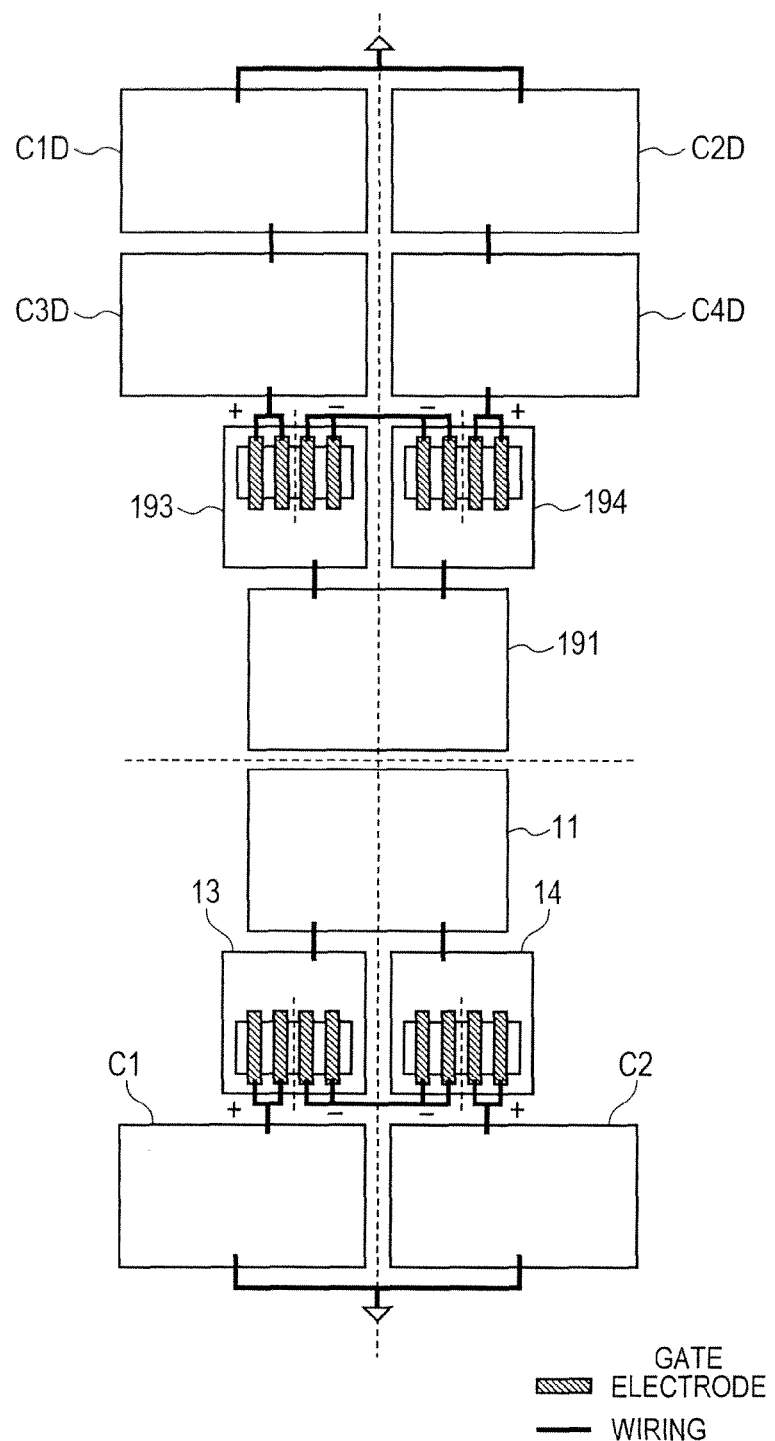
FIG. 28 is a diagram showing a layout configuration of the oscillation circuit according to the invention.

FIG. 28 is a diagram showing an example of the layout configuration of the oscillation circuit having the pulse generation circuit 19 shown in FIGS. 13 and 15. As shown in FIG. 28, the pair of capacitors C1D and C2D, the pair of capacitors C3D and C4D, the pair of comparators 193 and 194, the pair of comparators 13 and 14, and the pair of capacitors C1 and C2 are each disposed side-by-side in the horizontal direction of the figure. These pairs are closely disposed in sequence from the top to the bottom of the figure. Further, the pair of capacitors C1D and C2D, the pair of capacitors C3D and C4D, the pair of comparators 193 and 194, the RS flip-flop 191, the RS flip-flop 11, the pair of comparators 13 and 14, and the pair of capacitors C1 and C2 are disposed symmetrically with the vertical direction of the figure as a symmetry axis. Thus, circuits for generating ones (output signals Q, QD) of the pairs of differential signals and circuits for generating the others (output signal QB, QBD) of the pairs of differential signals are disposed symmetrically, which reduces the variation in accuracy between the differential signals.

Further, on the comparator 193, four gate electrodes are equally spaced in sequence from right to left in the upper part of the comparator 193. The longitudinal direction of the gate electrodes is the vertical direction of the figure. In the example of FIG. 28, the right two of the four gate electrodes are used as the inverting input terminal of the comparator 193, and the left two electrodes are used as the non-inverting input terminal of the comparator 193. The two gate electrodes for the inverting input terminal of the comparator 193 and the two gate electrodes for the non-inverting input terminal are disposed symmetrically with the vertical direction of the figure as a symmetry axis. The layout configuration of four gate electrodes on the comparator 194 is the same as that of the comparator 193, and will not be described again. Further, the layout configuration of the respective four gate electrodes disposed on the comparators 13 and 14 is the same as that shown in FIG. 27, and will not be described again.

This layout configuration can reduce the length of wiring for coupling the comparator 13 and the capacitor C1, the length of wiring for coupling the comparator 14 and the capacitor C2, the length of wiring for coupling the comparator 193 and the capacitor C3D, and the length of wiring for coupling the comparator 194 and the capacitor C4D, which suppresses malfunctions due to the influence of wiring capacitance.

Layout Configuration Example of Capacitor

Figure 29A:
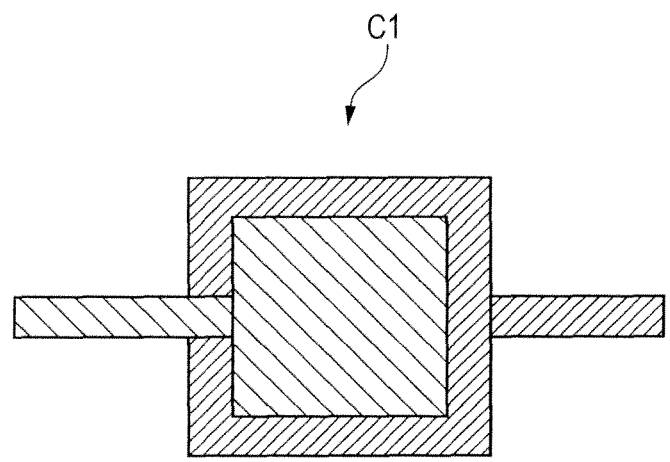
FIG. 29A is a diagram for explaining a configuration of the capacitor according to the invention.

Next, the layout configuration of the capacitor used in the oscillation circuit according to the invention will be described. FIG. 29A representatively shows an example of the layout configuration of the capacitor C1. Further, FIG. 29B representatively shows another example of the layout configuration of the capacitor C1.

As shown in FIG. 29A, one electrode of the capacitor C1 is formed by a wiring disposed in the upper part of two laminated wiring layers, and the other electrode of the capacitor C1 is formed by a wiring disposed in the lower part of the two laminated wiring layers. Thus, the capacitor C1 is configured by the respective wirings disposed in the two laminated wiring layers, which suppresses capacitance value change due to fluctuations in temperature or power supply voltage.

Figure 29B:
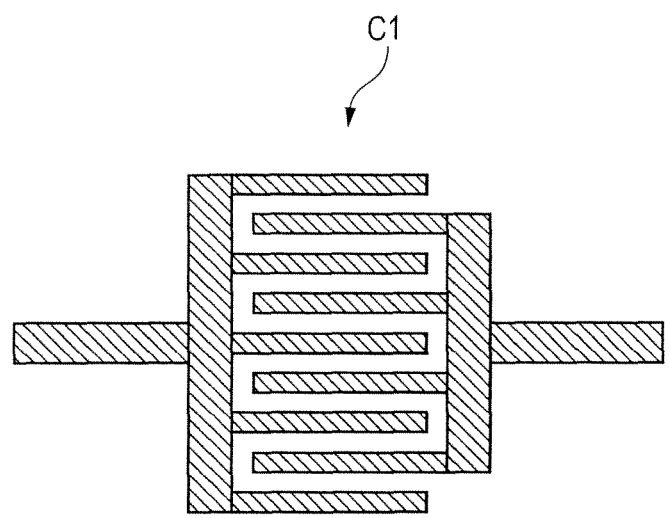
FIG. 29B is a diagram for explaining a configuration of the capacitor according to the invention.

As shown in FIG. 29B, one electrode of the capacitor C1 is formed by a first wiring having a plurality of comb-like protrusions disposed in a wiring layer. Further, the other electrode of the capacitor C1 is formed by a second wiring having a plurality of comb-like protrusions disposed in the same wiring layer as the first wiring. The first wiring and the second wiring are opposed in the horizontal direction of the figure, and the protrusions are alternately arranged. Thus, the capacitor C1 is configured by the two wirings disposed in the same wiring layer, which suppresses capacitance value change due to fluctuations in temperature or power supply voltage.

As described above, the oscillation circuits according to the first to sixteenth embodiments can accurately output the oscillation signals having the desired frequency even when the delay time Td caused by the operation delay of the comparator and the RS flip-flop varies with fluctuations in temperature or power supply voltage.

The present invention is not limited to the above embodiments, and can be modified as appropriate without departing from the spirit and scope of the invention. While the above embodiments have been described by way of example in which the capacitors C1 and C2 have substantially the same capacitance value, the invention is not limited thereto. The respective capacitance values of the capacitors C1 and C2 can be changed as appropriate in accordance with the duty ratio between the output signals (oscillation signals) Q and QB.

Further, while the above embodiments have been described by way of example in which the current source circuit (e.g., constant current source circuit B1 in FIG. 1) is provided on either the power supply voltage terminal VDD side or the ground voltage terminal GND side and the capacitors C1 and C2 are provided at the nodes X1 and Y1 respectively in the electric-charge charge/discharge unit, the invention is not limited thereto. The electric-charge charge/discharge unit can be modified as appropriate to a circuit configuration in which respective current source circuits are individually provided on the power supply voltage terminal VDD side and the ground voltage terminal GND side and one common capacitor is provided at a common node in place of the nodes X1 and Y1. In this case, the common node is coupled to, for example, the non-inverting input terminal of the comparator 13 and the inverting input terminal of the comparator 14. Further, a reference voltage A is supplied to the inverting input terminal of the comparator 13, and a reference voltage B different from the reference voltage A is supplied to the non-inverting input terminal of the comparator 14. That is, in this case, the comparator 13 detects whether or not the voltage level of the common node which gradually rises by current flowing through the current source circuit on the power supply voltage terminal VDD side has reached the reference voltage A. On the other hand, the comparator 14 detects whether or not the voltage level of the common node which gradually falls by current flowing through the current source circuit on the ground voltage terminal GND side has reached the reference voltage B.

Further, while the above embodiments have been described by way of example in which the one current source circuit (e.g., constant current source circuit B1 in FIG. 1) for feeding the current to the nodes X1 and Y1 is provided in the electric-charge charge/discharge unit, the invention is not limited thereto. The electric-charge charge/discharge unit can be modified as appropriate to a circuit configuration in which a current source circuit for feeding current to the node X1 and a current source circuit for feeding current to the node Y1 are provided individually.

Moreover, the oscillation circuit disclosed in Patent Document 2 is configured without a comparator having a response delay time, and it is not considered possible to easily think of the application of the technique as it is to the oscillation circuit having comparators disclosed in Patent Document 1.

What is claimed is:

1. An oscillation circuit comprising:
an RS flip-flop for generating an output signal based on a set signal and a reset signal;
an electric-charge charge/discharge unit which has first and second capacitors, and charges or discharges the first and second capacitors complementarily based on the output signal;
a first comparator which compares a first voltage according to electric charge accumulated in the first capacitor and a first reference voltage, and outputs the set signal;
a second comparator which compares a second voltage according to electric charge accumulated in the second capacitor and the first reference voltage, and outputs the reset signal; and
a control unit for controlling a timing, to compensate for variations of signals in the RS flip-flop, the first comparator, and the second comparator, at which respective voltage levels of the first reference voltage and the first voltage match and a timing, to compensate for variations of signals in the RS flip-flop, the first comparator, and the second comparator, at which respective voltage levels of the first reference voltage and the second voltage match in response to a frequency of the output signal,
wherein the control unit controls slew rates of the first and second voltages in accordance with the frequency of the output signal.

2. The oscillation circuit according to claim 1, wherein the control unit has a control voltage generation unit for generating a control voltage according to the frequency of the output signal and a voltage control unit for generating a comparison voltage according to a difference between a second reference voltage and the control voltage, as the first reference voltage.

3. The oscillation circuit according to claim 2, wherein the voltage control unit comprises an integration circuit.

4. The oscillation circuit according to claim 2, wherein the control voltage generation unit has a first constant current source circuit for feeding a constant current and a switched capacitor resistor having a resistance value according to the frequency of the output signal, and generates the control voltage having a voltage level determined based on a current value of the current flowing through the first constant current source circuit and the resistance value of the switched capacitor resistor.

5. The oscillation circuit according to claim 1, wherein the control unit decreases slew rates of the first and second voltages with an increase in the frequency of the output signal, and increases the slew rates of the first and second voltages with a decrease in the frequency of the output signal.

6. The oscillation circuit according to claim 1,
wherein the control unit is a pulse generation circuit for generating a current control signal having a pulse width according to a period of the output signal, and
wherein the electric-charge charge/discharge unit further has a variable current source circuit for selectively feeding a current according to a logic value of the current control signal and a switch unit for controlling continuity between the variable current source circuit and the first capacitor, controlling continuity between the variable current source circuit and the second capacitor, continuity between a first power source and the first capacitor, and continuity between the first power source and the second capacitor, based on the output signal.

7. The oscillation circuit according to claim 6, further comprising a reference voltage generation unit for generating a second reference voltage as the first reference voltage.

8. The oscillation circuit according to claim 7, wherein the reference voltage generation unit has a third constant current source circuit for feeding a constant current and a first resistance element series-coupled to the third constant current source circuit, and generates the second reference voltage having a voltage level determined by a current value of the current flowing through the third constant current source circuit and a resistance value of the first resistance element.

9. The oscillation circuit according to claim 8, wherein the first resistance element comprises a variable resistance element having a resistance value according to a control signal from outside.

10. The oscillation circuit according to claim 8, further comprising:
a second resistance element which is series-coupled to the first resistance element and has a temperature dependence different from that of the first resistance element,
wherein the oscillation circuit generates the second reference voltage having a voltage level determined by the current value of the current flowing through the third constant current source circuit and respective resistance values of the first and second resistance elements.

11. The oscillation circuit according to claim 10, wherein the first and second resistance elements comprise variable resistance elements having a resistance value according to a control signal from outside.

12. The oscillation circuit according to claim 2, further comprising a reference voltage generation unit for generating the second reference voltage.

13. A PLL (Phase-locked loop) comprising:
an oscillation circuit according to claim 1;
a phase difference detection unit for detecting a phase difference between the output signal of the oscillation circuit and a feedback signal;
a loop filter for generating a control voltage according to a detection result of the phase difference detection unit;
a voltage-controlled oscillation circuit for generating a clock signal having a frequency according to the control voltage; and
a frequency division circuit for generating a frequency-divided clock signal as the feedback signal by frequency-dividing the clock signal.

14. A semiconductor integrated circuit comprising:
an oscillation circuit according to claim 1 which outputs the output signal as a clock signal; and
an internal circuit which operates in synchronization with the clock signal.

15. A semiconductor integrated circuit comprising:
a mode switching unit for switching between a normal operation mode and a stop mode;
as oscillation circuit according to claim 1 which outputs the output signal as a clock signal in the normal operation mode and outputs a fixed voltage in the stop mode; and
an internal circuit which operates in synchronization with the clock signal in the normal operation mode.

16. An oscillation circuit comprising:
an RS flip-flop for generating an output signal based on a set signal and a reset signal;
an electric-charge charge/discharge unit which has first and second capacitors, and charges or discharges the first and second capacitors complementarily based on the output signal;

a first comparator which compares a first voltage according to electric charge accumulated in the first capacitor and a first reference voltage, and outputs the set signal;
a second comparator which compares a second voltage according to electric charge accumulated in the second capacitor and the first reference voltage, and outputs the reset signal; and
a control unit for controlling a timing at which respective voltage levels of the first reference voltage and the first voltage match and a timing at which respective voltage levels of the first reference voltage and the second voltage match in accordance with a frequency of the output signal,
wherein the control unit has a control voltage generation unit for generating a control voltage according to the frequency of the output signal and a voltage control unit for generating a comparison voltage according to a difference between a second reference voltage and the control voltage, as the first reference voltage,
wherein the electric-charge charge/discharge unit further has a second constant current source circuit for feeding a constant current and a switch unit for controlling continuity between the second constant current source circuit and the first capacitor, continuity between the second constant current source circuit and the second capacitor, continuity between a first power source and the first capacitor, and continuity between the first power source and the second capacitor, based on the output signal, and
wherein the electric-charge charge/discharge unit, as the control voltage generation unit, further generates the control voltage having a voltage level determined based on a current value of the current flowing through the second constant current source circuit and a resistance value of a switched capacitor resistor comprised of the switch unit and the first and second capacitors.

17. An oscillation circuit comprising:
an RS flip-flop for generating an output signal based on a set signal and a reset signal;
an electric-charge charge/discharge unit which has first and second capacitors, and charges or discharges the first and second capacitors complementarily based on the output signal;
a first comparator which compares a first voltage according to electric charge accumulated in the first capacitor and a first reference voltage, and outputs the set signal;
a second comparator which compares a second voltage according to electric charge accumulated in the second capacitor and the first reference voltage, and outputs the reset signal; and
a control unit for controlling a timing at which respective voltage levels of the first reference voltage and the first voltage match and a timing at which respective voltage levels of the first reference voltage and the second voltage match in accordance with a frequency of the output signal,
wherein the control unit has a control voltage generation unit for generating a control voltage according to the frequency of the output signal and a voltage control unit for controlling slew rates of the first and second voltages in accordance with a difference between a second reference voltage as the first reference voltage and the control voltage.

18. The oscillation circuit according to claim 17, wherein the voltage control unit comprises an integration circuit.

19. The oscillation circuit according to claim 17, wherein the control voltage generation unit has a first constant current source circuit for feeding a constant current and a switched capacitor resistor having a resistance value according to the frequency of the output signal, and generates the control voltage having a voltage level determined based on a current value of the current flowing through the first constant current source circuit and the resistance value of the switched capacitor resistor.

20. The oscillation circuit according to claim 17,
wherein the voltage control unit generates a comparison voltage according to a difference between the second reference voltage and the control voltage, and
wherein the electric-charge charge/discharge unit further has a variable current source circuit for feeding a current according to the comparison voltage and a switch unit for controlling continuity between the variable current source circuit and the first capacitor, controlling continuity between the variable current source circuit and the second capacitor, continuity between a first power source and the first capacitor, and continuity between the first power source and the second capacitor, based on the output signal.

21. The oscillation circuit according to claim 17,
wherein the voltage control unit generates a comparison voltage according to a difference between the second reference voltage and the control voltage,
wherein the electric-charge charge/discharge unit further has a second constant current source circuit for feeding a constant current and a switch unit for controlling continuity between the second constant current source circuit and the first capacitor, continuity between the second constant current source circuit and the second capacitor, continuity between a first power source and the first capacitor, and continuity between the first power source and the second capacitor, based on the output signal, and
wherein the first and second capacitors are variable capacitors having capacitance values according to the comparison voltage.

22. An oscillation circuit comprising:
an RS flip-flop for generating an output signal based on a set signal and a reset signal;
an electric-charge charge/discharge unit which has first and second capacitors, and charges or discharges the first and second capacitors complementarily based on the output signal;
a first comparator which compares a first voltage according to electric charge accumulated in the first capacitor and a first reference voltage, and outputs the set signal;
a second comparator which compares a second voltage according to electric charge accumulated in the second capacitor and the first reference voltage, and outputs the reset signal; and
a control unit for controlling a timing at which respective voltage levels of the first reference voltage and the first voltage match and a timing at which respective voltage levels of the first reference voltage and the second voltage match in accordance with a frequency of the output signal,
wherein the control unit is a pulse generation circuit for generating a current control signal having a pulse width according to a period of the output signal, and
wherein the electric-charge charge/discharge unit further has a variable current source circuit for selectively feeding a current according to a logic value of the current control signal and a switch unit for controlling continuity between the variable current source circuit and the first capacitor, controlling continuity between the variable current source circuit and the second capacitor, continuity between a first power source and the first capacitor, and continuity between the first power source and the second capacitor, based on the output signal, wherein the pulse generation circuit generates the current control signal having a first logic value during a duration according to a duration from when the voltage level of the first or second voltage reaches the first reference voltage to when a logic value of the output signal changes, and generates the current control signal having a second logic value different from the first logic value except during the duration.

23. The oscillation circuit according to claim 22, wherein the pulse generation circuit generates the current control signal having the first logic value during substantially the same duration as the duration from when the voltage level of the first or second voltage reaches the first reference voltage to when the logic value of the output signal changes, and generates the current control signal having the second logic value different from the first logic value except during the duration.

24. The oscillation circuit according to claim 22, wherein if the current control signal has the first logic value, the variable current source circuit feeds a current larger than if the current control signal has the second logic value.

25. The oscillation circuit according to claim 22, wherein if the current control signal has the first logic value, the variable current source circuit feeds substantially two times a current fed if the current control signal has the second logic value.

* * * * *